(12) United States Patent
Kim

(10) Patent No.: US 12,132,035 B2
(45) Date of Patent: Oct. 29, 2024

(54) DISPLAY DEVICE AND METHOD OF MANUFACTURING THE SAME

(71) Applicant: Samsung Display Co., LTD., Yongin-si (KR)

(72) Inventor: Hyun Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 702 days.

(21) Appl. No.: 17/306,409

(22) Filed: May 3, 2021

(65) Prior Publication Data

US 2022/0115363 A1 Apr. 14, 2022

(30) Foreign Application Priority Data

Oct. 14, 2020 (KR) .................. 10-2020-0133028

(51) Int. Cl.
| | |
|---|---|
| H01L 25/16 | (2023.01) |
| H01L 25/075 | (2006.01) |
| H01L 27/12 | (2006.01) |
| H01L 33/44 | (2010.01) |
| H01L 33/54 | (2010.01) |
| H01L 33/60 | (2010.01) |
| H01L 33/62 | (2010.01) |

(52) U.S. Cl.
CPC ........ *H01L 25/167* (2013.01); *H01L 27/1259* (2013.01); *H01L 33/44* (2013.01); *H01L 33/54* (2013.01); *H01L 33/60* (2013.01); *H01L 33/62* (2013.01)

(58) Field of Classification Search
CPC . H01L 33/62; H01L 33/60; H01L 2933/0066; H01L 27/1214
See application file for complete search history.

(56) References Cited

U.S. PATENT DOCUMENTS

| | | | |
|---|---|---|---|
| 10,026,777 B2 | 7/2018 | Kang et al. | |
| 10,769,990 B2 | 9/2020 | Cho et al. | |
| 2019/0172978 A1* | 6/2019 | Chen | ............... H01L 25/0753 |
| 2019/0189595 A1* | 6/2019 | Lee | ............... H01L 25/0753 |
| 2020/0135971 A1 | 4/2020 | Beak et al. | |
| 2021/0399040 A1 | 12/2021 | Chai et al. | |

FOREIGN PATENT DOCUMENTS

| | | |
|---|---|---|
| KR | 10-2018-0071465 | 6/2018 |
| KR | 10-2019-0098305 | 8/2019 |
| KR | 10-2020-0034896 | 4/2020 |
| KR | 10-2020-0037906 | 4/2020 |

(Continued)

OTHER PUBLICATIONS

International Search Report corresponding to International Application No. PCT/KR2021/011867 dated Dec. 13, 2021.

*Primary Examiner* — Antonio B Crite

(74) *Attorney, Agent, or Firm* — KILE PARK REED & HOUTTEMAN PLLC

(57) ABSTRACT

A display device includes a substrate including pixels, a first electrode and a second electrode disposed on the substrate and spaced apart from each other, an inclined pattern disposed on the first electrode and the second electrode, the inclined pattern forming a space, and a first light emitting element disposed between the first electrode and the second electrode inside of the space formed by the inclined pattern.

11 Claims, 22 Drawing Sheets

(56) References Cited

FOREIGN PATENT DOCUMENTS

| | | |
|---|---|---|
| KR | 10-2020-0049394 | 5/2020 |
| KR | 10-2020-0070493 | 6/2020 |
| KR | 10-2020-0105598 | 9/2020 |
| KR | 10-2021-0148539 | 12/2021 |
| WO | WO-2020017718 A1 * 1/2020 | ......... H01L 25/0753 |

* cited by examiner

DISPLAY DEVICE AND METHOD OF MANUFACTURING THE SAME

CROSS-REFERENCE TO RELATED APPLICATION(S)

This application claims priority to and benefits of Korean Patent Application No. 10-2020-0133028 under 35 U.S.C. § 119, filed on Oct. 14, 2020 in the Korean Intellectual Property Office, the entire contents of which are incorporated herein by reference.

BACKGROUND

1. Technical Field

The disclosure relates to a display device and a method of manufacturing the same.

2. Description of the Related Art

In recent years, as interest in information display is increasing, research and development on display devices are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a display device and a method of manufacturing the same, which can improve front emission efficiency and reduce manufacturing cost.

The object of the disclosure is not limited to the above-mentioned object, and other objects not mentioned can be clearly understood by those skilled in the art from the following description.

A display device according to an embodiment may include a substrate including a plurality of pixels; a first electrode and a second electrode disposed on the substrate and spaced apart from each other; an inclined pattern disposed on the first electrode and the second electrode, the inclined pattern forming a space; and a first light emitting element disposed between the first electrode and the second electrode inside of the space formed by the inclined pattern.

The space formed by the inclined pattern may be located between the first electrode and the second electrode.

The inclined pattern may include an inorganic insulating material.

The inclined pattern may include a plurality of first layers and a plurality of second layers having different refractive indices, and the plurality of first layers and the plurality of second layers may be alternately stacked.

The inclined pattern may include an opening at least partially overlapping the first light emitting element.

The inclined pattern may include a first inclined pattern disposed on the first electrode; and a second inclined pattern disposed on the second electrode.

An inclination angle of the first inclined pattern may be substantially same as an inclination angle of the second inclined pattern.

The display device may further include a first contact electrode electrically connecting an end of the first light emitting element to the first electrode; and a second contact electrode electrically connecting another end of the first light emitting element to the second electrode. The first contact electrode and the second contact electrode may be disposed inside of the space formed by the inclined pattern.

The first contact electrode and the second contact electrode may be disposed on a same layer.

The display device may further include a first insulating layer disposed between the first contact electrode and the second contact electrode.

The display device may further include a second insulating layer overlapping the inclined pattern inside of the space formed by the inclined pattern.

The display device may further include a second light emitting element disposed on the inclined pattern outside of the space formed by the inclined pattern.

A method of manufacturing a display device according to an embodiment may include forming a passivation layer and a bank pattern on a substrate, the substrate including a plurality of pixels; forming a first electrode and a second electrode on the passivation layer; forming an inclined pattern including an opening on the bank pattern; removing the bank pattern to form a space; and forming a light emitting element into the space through the opening of the inclined pattern.

The forming of the passivation layer and the bank pattern may include forming an organic layer on the substrate; and forming the passivation layer and the bank pattern simultaneously by patterning the organic layer.

The forming of the inclined pattern may include alternately stacking a plurality of first layers and a plurality of second layers having different refractive indices on the bank pattern; and forming the opening of the inclined pattern exposing the bank pattern by patterning the plurality of the first layers and the plurality of the second layers.

The removing of the bank pattern may include etching the bank pattern through the opening of the inclined pattern.

The providing of the light emitting element may include supplying ink into the space through the opening, the ink including the light emitting element.

The method may further include forming a first contact electrode electrically connecting an end of the light emitting element to the first electrode in the space; and forming a second contact electrode electrically connecting another end of the light emitting element to the second electrode in the space.

The method may further include forming an insulating layer on the inclined pattern.

The insulating layer may overlap the light emitting element inside of the space.

Detailed configurations of other embodiments are included in the detailed description and drawings.

BRIEF DESCRIPTION OF THE DRAWINGS

The accompanying drawings, which are included to provide a further understanding of the disclosure, and are incorporated in and constitute a part of this specification, illustrate embodiments, and, together with the description, serve to explain principles of the disclosure, in which.

DETAILED DESCRIPTION OF THE EMBODIMENTS

Figure 1:
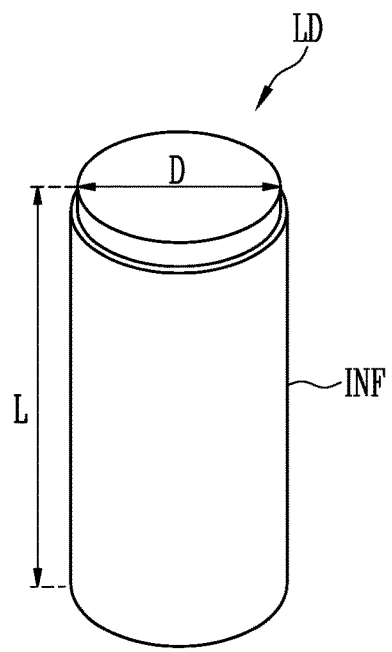
FIGS. 1 and 2 are perspective and schematic cross-sectional views illustrating a light emitting element according to an embodiment.

Advantages and features of the disclosure, and methods for accomplishing the same will be more clearly understood from embodiments described below with reference to the accompanying drawings. However, the disclosure is not limited to the following embodiments but may be implemented in various different forms. The embodiments are provided in the disclosure and to fully inform a person having ordinary skill in the art to which the disclosure pertains the scope of the disclosure. The disclosure may be defined by the scope of the appended claims.

In the drawings, sizes, thicknesses, ratios, and dimensions of the elements may be exaggerated for ease of description and for clarity. Like numbers refer to like elements throughout.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms used in the disclosure are for describing embodiments and are not intended to limit the disclosure. In the disclosure, the singular forms are intended to include the plural forms as well, unless the context clearly indicates otherwise. As used in the disclosure, the terms "comprises" and/or "comprising" "includes" and/or "including", "has" and/or "have" and/or "having" and variations thereof do not exclude the presence or addition of one or more other components, steps, operations and/or elements to the mentioned component, step, operation and/or element.

In addition, the term "connection" may include not only electrical connection but also physical connection, may include direct connection as well as indirect connection through other components, or may include an integral connection or a non-integral connection.

A phrase "an element or a layer is disposed on another element or another layer" may refer to that the element may be disposed directly on another element and/or the element may be disposed indirectly on another element via another element or another layer. Like reference numerals generally refer to like elements throughout the disclosure.

Although the terms first, second, etc. may be used herein to describe various components, these components should not be limited by these terms. These terms are only used to distinguish one component from another component. Thus, a first component discussed below may be a second component within the spirit and scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described in more detail with reference to the accompanying drawings.

Figure 2:
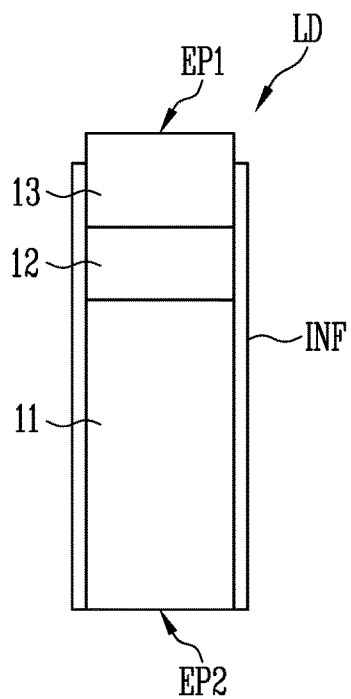

FIGS. 1 and 2 are perspective and schematic cross-sectional views illustrating a light emitting element according to an embodiment. FIGS. 1 and 2 show a light emitting element LD in a substantially column shape, but the type and/or shape of the light emitting element LD is not limited thereto.

Referring to FIGS. 1 and 2, the light emitting element LD may include a first semiconductor layer 11, a second semiconductor layer 13, and an active layer 12 interposed or disposed between the first and second semiconductor layers 11 and 13. For example, when a direction in which the light emitting element LD extends is referred to as a length L direction, the light emitting element LD may include the first semiconductor layer 11, the active layer 12, and the second semiconductor layer 13 sequentially stacked each other along the length L direction.

The light emitting element LD may be provided or formed in the column shape extending along one or a direction. The light emitting element LD may have a first end EP1 and a second end EP2. One of the first and second semiconductor layers 11 and 13 may be disposed at the first end EP1 of the light emitting element LD. The other of the first and second semiconductor layers 11 and 13 may be disposed at the second end EP2 of the light emitting element LD.

According to an embodiment, the light emitting element LD may be a light emitting element manufactured in the column shape through an etching method or the like within the spirit and the scope of the disclosure. In the disclosure, the column shape may include a substantially rod-like shape or a substantially bar-like shape that may be long in the length L direction (for example, the aspect ratio is greater than 1), such as a substantially circular column or a substantially polygonal column, and the shape of the cross section is not particularly limited. For example, the length L of the light emitting element LD may be larger than the diameter D (or the width of the cross section).

The light emitting element LD may have a size as small as that of a nanometer scale to that of a micrometer scale. For example, the light emitting element LD may have the diameter D (or width) and/or the length L in a nanometer scale range to a micrometer scale range. However, the size of the light emitting element LD is not limited thereto. The size of the light emitting element LD may be variously changed according to design conditions of various devices using the light emitting device including the light emitting element LD as a light source, for example, a display device and the like within the spirit and the scope of the disclosure.

The first semiconductor layer 11 may be a semiconductor layer of a first conductivity type. For example, the first semiconductor layer 11 may include an N-type semiconductor layer. For example, the first semiconductor layer 11 may include the N-type semiconductor layer containing any one of InAlGaN, GaN, AlGaN, InGaN, AlN, and InN, and doped with a first conductivity type dopant such as Si, Ge, Sn, and the like within the spirit and the scope of the disclosure. However, the material constituting the first semiconductor layer 11 is not limited thereto, and the first semiconductor layer 11 may be formed of various other materials.

The active layer 12 may be disposed on the first semiconductor layer 11 and may be formed in a single quantum well structure or a multi-quantum well structure. The position of the active layer 12 may be variously changed according to the type of the light emitting element LD.

A cladding layer (not shown) doped with a conductive dopant may be formed or disposed on and/or under or below the active layer 12. For example, the cladding layer may be formed of an AlGaN layer or an InAlGaN layer. According to an embodiment, a material such as AlGaN, InAlGaN, and the like may be used to form the active layer 12, and various other materials may constitute the active layer 12.

The second semiconductor layer 13 may be disposed on the active layer 12 and may include a semiconductor layer of a different type from the first semiconductor layer 11. For example, the second semiconductor layer 13 may include a P-type semiconductor layer. For example, the second semiconductor layer 13 may include the P-type semiconductor layer containing at least one of InAlGaN, GaN, AlGaN, InGaN, AlN, and InN, or a combination thereof, and doped with a second conductivity type dopant such as Mg and the like within the spirit and the scope of the disclosure. However, the material constituting the second semiconductor layer 13 is not limited thereto, and various other materials may constitute the second semiconductor layer 13.

When a voltage greater than or equal to a threshold voltage is applied to both ends of the light emitting element LD, electron-hole pairs are coupled in the active layer 12 to cause the light emitting element LD to emit light. By controlling the light emitted from the light emitting element LD using this principle, the light emitting element LD may be used as a light source for various light emitting devices including pixels of the display device.

The light emitting element LD may further include an insulating film INF provided or disposed on the surface. The insulating film INF may be formed or disposed on the surface of the light emitting element LD to surround at least the outer circumferential surface of the active layer 12. Also, the insulating film INF may further surround some or a number of areas of the first and second semiconductor layers 11 and 13.

According to an embodiment, the insulating film INF may expose the both ends of the light emitting element LD having different polarities. For example, the insulating film INF may expose one or an end of each of the first and second semiconductor layers 11 and 13 positioned or disposed at the first and second ends EP1 and EP2 of the light emitting element LD. In an embodiment, the insulating film INF may expose side portions of the first and second semiconductor layers 11 and 13 adjacent to the first and second ends EP1 and EP2 of the light emitting element LD having different polarities.

According to an embodiment, the insulating film INF may include at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), and may be composed of a single layer or multiple layers. For example, the insulating film INF may be formed of a double layer composed of aluminum oxide ($AlO_x$) and silicon oxide ($SiO_x$), but the disclosure is not limited thereto. According to an embodiment, the insulating film INF may be omitted.

In a case that the insulating film INF is provided or disposed to cover or overlap the surface of the light emitting element LD, for example, the outer surface of the active layer 12, a short circuit of the active layer 12 with a first pixel electrode or a second pixel electrode, which will be described later, can be prevented. Accordingly, electrical stability of the light emitting element LD can be secured.

In a case that the insulating film INF is provided or disposed on the surface of the light emitting element LD, surface defects of the light emitting element LD may be minimized, thereby improving life and efficiency. In a case that a plurality of light emitting elements LD are disposed adjacent to each other, unwanted short circuits between the light emitting elements LD may be prevented.

In an embodiment, the light emitting element LD may further include components in addition to the first semiconductor layer 11, the active layer 12, the second semiconductor layer 13, and/or the insulating film INF surrounding them. For example, the light emitting element LD may further include at least one phosphor layer, active layer, semiconductor layer and/or electrode layer disposed on one or a side of the first semiconductor layer 11, the active layer 12 and/or the second semiconductor layer 13. For example, the light emitting element LD may further include the electrode layer disposed on the second semiconductor layer 13. The electrode layer may include a metal or a metal oxide. For example, as the electrode layer, ITO, IZO, ITZO, Cr, Ti, Al, Au, Ni, oxides thereof, or alloys thereof may be used alone or in combination. According to an embodiment, the electrode layer may be further disposed on the first semiconductor layer 11.

Although FIGS. 1 and 2 show the light emitting element LD in the column shape as an example, the type, structure, and/or shape of the light emitting element LD may be variously changed. For example, the light emitting element LD may be formed in a core-shell structure having a substantially polygonal cone shape.

A light emitting device including the light emitting element LD described above may be used in various types of devices that require a light source, including the display device. For example, the plurality of light emitting elements LD may be disposed in each pixel of a display panel, and the light emitting elements LD may be used as a light source of each pixel. However, the field to which the light emitting element LD is applied may not be limited to the above-described examples. For example, the light emitting element LD may be used for other types of devices that require a light source, such as a lighting device.

Figure 3:
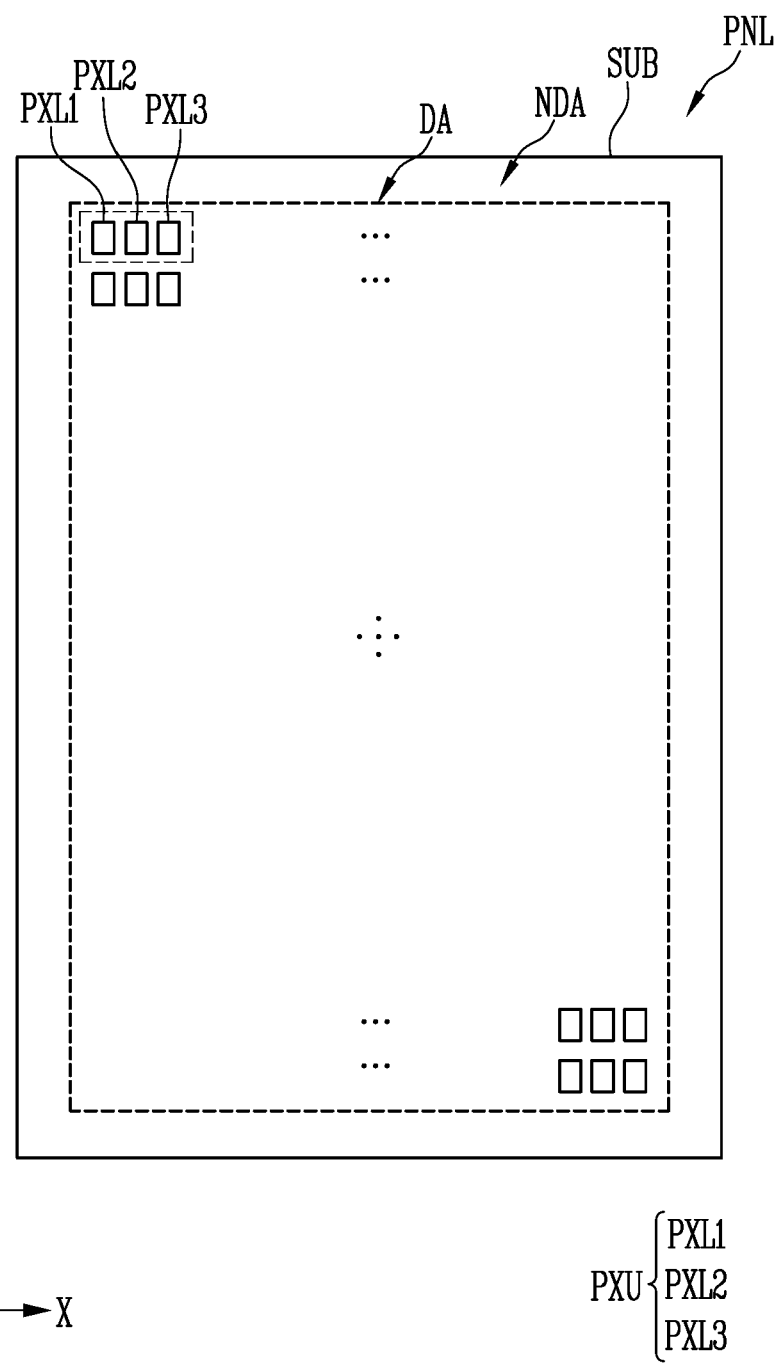
FIG. 3 is a plan view illustrating a display device according to an embodiment.

FIG. 3 is a plan view illustrating a display device according to an embodiment.

As an example of an electronic device in which the light emitting element LD described in the embodiments of FIGS. 1 and 2 can be used as a light source, FIG. 3 shows a display device, for example, a display panel PNL included in the display device.

Each pixel unit PXU of the display panel PNL and each pixel constituting the same may include at least one light emitting element LD. For convenience, in FIG. 3, a structure of the display panel PNL representing a display area DA is schematically shown. However, according to an embodiment, at least one driving circuit unit (for example, at least one of a scan driver and a data driver), wirings, and/or pads, which are not shown, may be further disposed on the display panel PNL.

Referring to FIG. 3, the display panel PNL may include a substrate SUB and a pixel unit PXU disposed on the substrate SUB. The pixel unit PXU may include first pixels PXL1, second pixels PXL2, and/or third pixels PXL3. Hereinafter, when referring to at least one pixel among the first pixels PXL1, the second pixels PXL2, and the third pixels PXL3, or when referring to two or more types of pixels, "pixel PXL" or "pixels PXL" may be used.

The substrate SUB may constitute a base member of the display panel PNL, and may be a rigid or flexible substrate or film. For example, the substrate SUB may be a rigid substrate made of glass or tempered glass, a flexible substrate (or thin film) made of plastic or metal, or at least one insulating layer. The material and/or physical properties of the substrate SUB are not particularly limited.

In an embodiment, the substrate SUB may be substantially transparent. Here, "substantially transparent" may mean that light can be transmitted more than a predetermined transmittance. In an embodiment, the substrate SUB may be translucent or opaque. The substrate SUB may include a reflective material according to an embodiment.

The display panel PNL and the substrate SUB for forming the same may include a display area DA for displaying an image and a non-display area NDA excluding the display area DA.

Pixels PXL may be disposed in the display area DA. Various wirings, pads, and/or built-in circuit units electrically connected to the pixels PXL of the display area DA may be disposed in the non-display area NDA. The pixels PXL may be regularly arranged or disposed according to a stripe arrangement structure, a PenTile® arrangement structure, or the like within the spirit and the scope of the disclosure. However, the arrangement structure of the pixels PXL is not limited thereto, and the pixels PXL may be arranged or disposed in the display area DA in various structures and/or manners.

According to an embodiment, two or more types of pixels PXL emitting light of different colors may be disposed in the display area DA. For example, the first pixels PXL1 emitting light of a first color, the second pixels PXL2 emitting light of a second color, and the third pixels PXL3 emitting light of a third color may be arranged or disposed in the display area DA. At least one first, second, and third pixels PXL1, PXL2, and PXL3 arranged or disposed to be adjacent to each other may constitute one pixel unit PXU that emits light of various colors. For example, the first, second, and third pixels PXL1, PXL2, and PXL3 may be sub-pixels each emitting light of a predetermined color. According to an embodiment, the first pixel PXL1 may be a red pixel emitting red light, the second pixel PXL2 may be a green pixel emitting green light, and the third pixel PXL3 may be a blue pixel emitting blue light. However, the disclosure is not limited thereto.

In an embodiment, the first pixel PXL1, the second pixel PXL2, and the third pixel PXL3 may include a light emitting element of the first color, a light emitting element of the second color, and a light emitting element of the third color, respectively, as a light source, and may emit light of the first color, the second color, and the third color, respectively. In an embodiment, the first pixel PXL1, the second pixel PXL2, and the third pixel PXL3 may have light emitting elements that emit light of the same color, and may further include color conversion layers and/or color filters of different colors disposed on the light emitting elements, respectively, to emit light of the first color, the second color, and the third color. However, the color, type, and/or number of the pixels PXL constituting each pixel unit PXU are not particularly limited. For example, the color of light emitted by each pixel PXL may be variously changed.

Each pixel PXL may include at least one light source driven by a predetermined control signal (for example, a scan signal and a data signal) and/or a predetermined power source (for example, a first power source and a second power source). In an embodiment, the light source may include at least one light emitting element LD according to any one of the embodiments of FIGS. 1 and 2, for example, ultra-small light emitting elements LD in the column shape having a size as small as the nanometer scale to the micrometer scale. However, the disclosure is not limited thereto, and various types of light emitting elements LD may be used as the light source of the pixel PXL.

Figure 4:
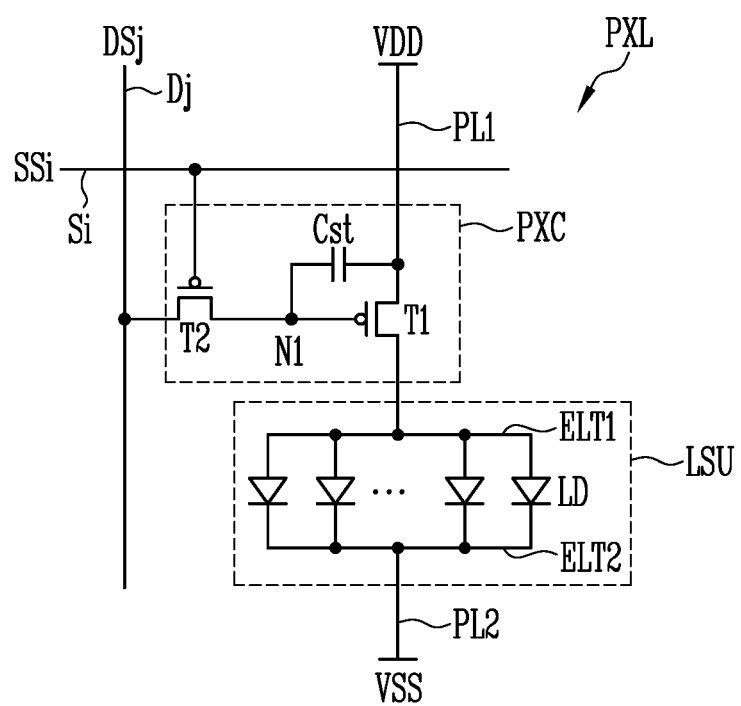
FIGS. 4 to 6 are equivalent circuit diagrams illustrating a pixel according to an embodiment.
Figure 5:
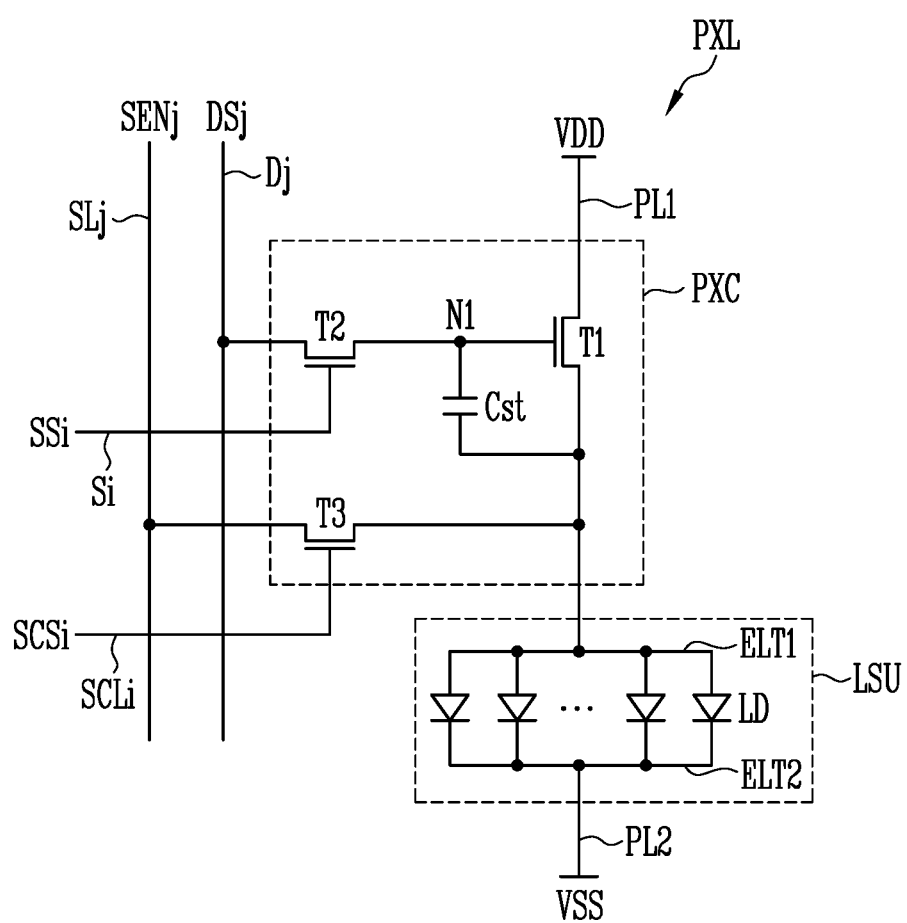
Figure 6:
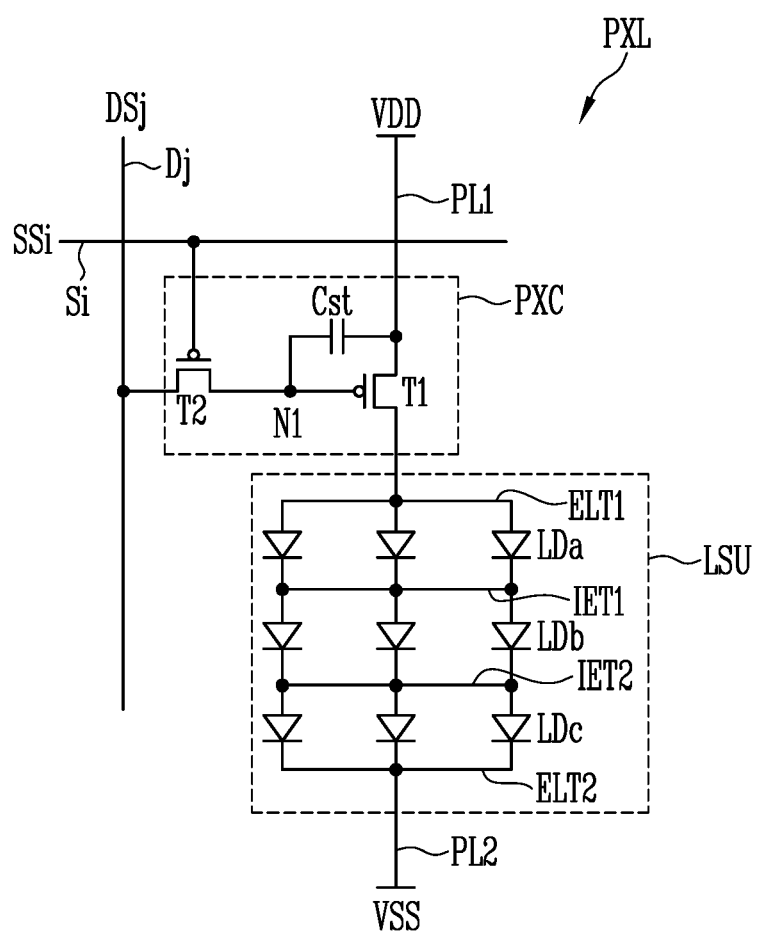

FIGS. 4 to 6 are equivalent circuit diagrams illustrating a pixel according to an embodiment.

For example, FIGS. 4 to 6 show embodiments of the pixel PXL applicable to an active display device. However, the types of the pixel PXL and the display device are not limited thereto.

According to an embodiment, the pixel PXL shown in FIGS. 4 to 6 may be any one of the first, second, and third pixels PXL1, PXL2, and PXL3 included in the display panel PNL of FIG. 3. The first, second, and third pixels PXL1, PXL2, and PXL3 may have substantially the same or similar structure to each other.

Referring to FIG. 4, the pixel PXL may include a light source unit LSU for generating light with a luminance corresponding to a data signal, and a pixel circuit PXC for driving the light source unit LSU.

The light source unit LSU may include at least one light emitting element LD electrically connected between a first power source VDD and a second power source VSS. For example, the light source unit LSU may include a first electrode ELT1 (referred to as a first pixel electrode or a first alignment electrode) electrically connected to the first power source VDD via the pixel circuit PXC and a first power source line PL1, a second electrode ELT2 (referred to as a second pixel electrode or a second alignment electrode) electrically connected to the second power source VSS through a second power source line PL2, and a plurality of light emitting elements LD electrically connected in the same direction between the first and second electrodes ELT1 and ELT2. In an embodiment, the first electrode ELT1 may be an anode electrode, and the second electrode ELT2 may be a cathode electrode.

Each of the light emitting elements LD may include a first end (for example, a P-type end) electrically connected to the first power source VDD through the first electrode ELT1 and/or the pixel circuit PXC, and a second end (for example, an N-type end) electrically connected to the second power source VSS through the second electrode ELT2. For example, the light emitting elements LD may be electrically connected in parallel in a forward direction between the first and second electrodes ELT1 and ELT2. Each light emitting element LD electrically connected in the forward direction between the first power source VDD and the second power source VSS may constitute a respective effective light source, and these effective light sources may collectively form the light source unit LSU of the pixel PXL.

The first power source VDD and the second power source VSS may have different potentials so that the light emitting elements LD emit light. As an example, the first power source VDD may be set as a high potential power source, and the second power source VSS may be set as a low potential power source. A potential difference between the first power source VDD and the second power source VSS may be set to be greater than or equal to threshold voltages of the light emitting elements LD during an emission period of the pixel PXL.

One or an end (for example, the P-type end) of the light emitting elements LD constituting each light source unit LSU may be commonly electrically connected to the pixel circuit PXC through one electrode of the light source unit LSU (for example, the first electrode ELT1 of each pixel PXL), and may be electrically connected to the first power source VDD through the pixel circuit PXC and the first power source line PL1. The other end (for example, the N-type end) of the light emitting elements LD may be commonly electrically connected to the second power source VSS through the other electrode of the light source unit LSU (for example, the second electrode ELT2 of each pixel PXL) and the second power source line PL2.

The light emitting elements LD may emit light with a luminance corresponding to a driving current supplied through a corresponding pixel circuit PXC. For example, during each frame period, the pixel circuit PXC may supply the driving current corresponding to a grayscale value to be expressed in a corresponding frame to the light source unit LSU. The driving current supplied to the light source unit LSU may divide and flow to the light emitting elements LD electrically connected in the forward direction. Accordingly, each light emitting element LD may emit light with a luminance corresponding to the current flowing therethrough, and the light source unit LSU may emit light with the luminance corresponding to the driving current.

The pixel circuit PXC may be electrically connected between the first power source VDD and the first electrode ELT1. The pixel circuit PXC may be electrically connected to a scan line Si and a data line Dj of a corresponding pixel PXL. For example, in a case that the pixel PXL is disposed on an i-th horizontal line (row) and a j-th vertical line (column) of the display area DA, the pixel circuit PXC of the pixel PXL may be electrically connected to an i-th scan line Si and a j-th data line Dj of the display area DA, where i and j may be natural numbers.

According to an embodiment, the pixel circuit PXC may include a plurality of transistors and at least one capacitor. For example, the pixel circuit PXC may include a first transistor T1, a second transistor T2, and a storage capacitor Cst.

The first transistor T1 may be electrically connected between the first power source VDD and the light source unit LSU. For example, a first electrode (for example, a source electrode) of the first transistor T1 may be electrically connected to the first power source VDD, and a second electrode (for example, a drain electrode) of the first transistor T1 may be electrically connected to the first electrode ELT1. A gate electrode of the first transistor T1 may be electrically connected to a first node N1. The first transistor T1 may control the driving current supplied to the light source unit LSU in response to a voltage of the first node N1. For example, the first transistor T1 may be a driving transistor that controls the driving current of the pixel PXL.

The second transistor T2 may be electrically connected between the data line Dj and the first node N1. For example, a first electrode (for example, a source electrode) of the second transistor T2 may be electrically connected to the data line Dj, and a second electrode (for example, a drain electrode) of the second transistor T2 may be electrically connected to the first node N1. A gate electrode of the second transistor T2 may be electrically connected to the scan line Si. The second transistor T2 may be turned on when a scan signal SSi of a gate-on voltage (for example, a low level voltage) is supplied from the scan line Si to electrically connect the data line Dj and the first node N1.

A data signal DSj of a corresponding frame may be supplied to the data line Dj for each frame period. The data signal DSj may be transmitted to the first node N1 through the second transistor T2 turned on during a period in which the scan signal SSi of the gate-on voltage is supplied. For example, the second transistor T2 may be a switching transistor for transmitting each data signal DSj into the pixel PXL.

One electrode of the storage capacitor Cst may be electrically connected to the first power source VDD, and the other electrode may be electrically connected to the first node N1. The storage capacitor Cst may charge a voltage corresponding to the data signal DSj supplied to the first node N1 during each frame period.

In FIG. 4, all transistors included in the pixel circuit PXC, for example, the first and second transistors T1 and T2 are shown as P-type transistors. However, the disclosure is not limited thereto. At least one of the first and second transistors T1 and T2 may be changed to an N-type transistor. The pixel circuit PXC may be structured with pixel circuits of various structures and/or driving methods.

Referring to FIG. 5, the pixel circuit PXC may be further electrically connected to a sensing control line SCLi and a sensing line SLj. As an example, the pixel circuit PXC of the pixel PXL disposed on the i-th horizontal line and the j-th vertical line of the display area DA may be electrically connected to an i-th sensing control line SCLi and a j-th sensing line SLj of the display area DA. The pixel circuit PXC may further include a third transistor T3. As an example, in an embodiment, the sensing line SLj may be omitted, and characteristics of the pixel PXL may be detected by detecting a sensing signal SENj through the data line Dj of the corresponding pixel PXL (or adjacent pixel).

The third transistor T3 may be electrically connected between the first transistor T1 and the sensing line SLj. For example, one electrode of the third transistor T3 may be electrically connected to one electrode (for example, the source electrode) of the first transistor T1 electrically connected to the first electrode ELT1, and the other electrode of the third transistor T3 may be electrically connected to the sensing line SLj. When the sensing line SLj is omitted, the other electrode of the third transistor T3 may be electrically connected to the data line Dj.

A gate electrode of the third transistor T3 may be electrically connected to the sensing control line SCLi. When the sensing control line SCLi is omitted, the gate electrode of the third transistor T3 may be electrically connected to the scan line Si. The third transistor T3 may be turned on by a sensing control signal SCSi of a gate-on voltage (for example, a high level voltage) supplied to the sensing control line SCLi during a predetermined sensing period to electrically connect the sensing line SLj and the first transistor T1.

According to an embodiment, the sensing period may be a period for extracting characteristics (for example, a threshold voltage of the first transistor T1 and the like) of each of the pixels PXL disposed in the display area DA. During the sensing period, the first transistor T1 may be turned on by supplying a predetermined reference voltage to which the first transistor T1 can be turned on to the first node N1 through the data line Dj and the second transistor T2, or by electrically connecting each pixel PXL to a current source or the like within the spirit and the scope of the disclosure. When the sensing control signal SCSi of the gate-on voltage is supplied to the third transistor T3, the third transistor T3 may be turned on and the first transistor T1 may be electrically connected to the sensing line SLj. Thereafter, the sensing signal SENj may be obtained through the sensing line SLj, and the characteristics of each pixel PXL including the threshold voltage of the first transistor T1 and the like may be detected using the sensing signal SENj. Information on the characteristics of each pixel PXL may be used to convert image data so that a deviation in characteristics between the pixels PXL disposed in the display area DA may be compensated.

In FIG. 5, an embodiment in which all of the first, second, and third transistors T1, T2, and T3 are N-type transistors is shown, but the disclosure is not limited thereto. For example, at least one of the first, second, and third transistors T1, T2, and T3 may be changed to a P-type transistor.

In FIGS. 4 and 5, an embodiment in which all effective light sources constituting each light source unit LSU, for example, the light emitting elements LD, are electrically connected in parallel is shown, but the disclosure is not limited thereto. For example, as shown in FIG. 6, the light source unit LSU of each pixel PXL may include at least two serial structures. In describing an embodiment of FIG. 6, detailed descriptions of configurations similar to or identical to those of the embodiments of FIGS. 4 and 5 (for example, the pixel circuit PXC) will be omitted.

Referring to FIG. 6, the light source unit LSU may include at least two light emitting elements electrically connected in series with each other. As an example, the light source unit LSU may include a first light emitting element LDa, a second light emitting element LDb, and a third light emitting element LDc electrically connected in series in the forward direction between the first power source VDD and the second power source VSS. The first, second, and third light emitting elements LDa, LDb, and LDc may constitute each effective light source.

Hereinafter, when referring to a specific or given light emitting element among the first, second, and third light emitting elements LDa, LDb, and LDc, the corresponding light emitting element may be referred to as "first light emitting element LDa", "second light emitting element LDb" or "third light emitting element LDc". When referring to at least one of the first, second, and third light emitting elements LDa, LDb, and LDc, or when referring to all of the first, second, and third light emitting elements LDa, LDb, and LDc, "light emitting element LD" or "light emitting elements LD" may be used.

A first end (for example, a P-type end) of the first light emitting element LDa may be electrically connected to the first power source VDD via the first electrode ELT1 (for example, the first pixel electrode) of the light source unit LSU and the like within the spirit and the scope of the disclosure. A second end (for example, an N-type end) of the first light emitting element LDa may be electrically connected to a first end (for example, a P-type end) of the second light emitting element LDb through a first intermediate electrode IET1.

The first end of the second light emitting element LDb may be electrically connected to the second end of the first light emitting element LDa. A second end (for example, an N-type end) of the second light emitting element LDb may be electrically connected to a first end (for example, a P-type end) of the third light emitting element LDc through a second intermediate electrode IET2.

The first end of the third light emitting element LDc may be electrically connected to the second end of the second light emitting element LDb. A second end (for example, an N-type end) of the third light emitting element LDc may be electrically connected to the second power source VSS via the second electrode ELT2 (for example, the second pixel electrode) of the light source unit LSU and the like within the spirit and the scope of the disclosure. As described above, the first, second, and third light emitting elements LDa, LDb, and LDc may be sequentially electrically connected in series between the first and second electrodes ELT1 and ELT2 of the light source unit LSU.

In FIG. 6, an embodiment in which the light emitting elements LD are electrically connected in a serial structure of three stages is shown, but the disclosure is not limited thereto. Two light emitting elements LD may be electrically connected in the series structure of two stages, or four or more light emitting elements LDs may be electrically connected in the series structure of four or more stages.

Assuming that the same luminance is expressed using light emitting element LD having the same conditions (for example, the same size and/or number), compared to the light source unit LSU having a structure in which the light emitting elements LD are electrically connected in parallel, in the light source unit LSU having a structure in which the light emitting elements LD are electrically connected in series, a voltage applied between the first and second electrodes ELT1 and ELT2 may increase, but the magnitude of the driving current flowing through the light source unit LSU may decrease. Accordingly, in a case that the light source unit LSU of each pixel PXL is in a series structure, panel current flowing through the display panel PNL can be reduced.

As in the above-described embodiments, each light source unit LSU may include the plurality of light emitting elements LD which are electrically connected in the forward direction between the first and second power sources VDD and VSS and constitute each effective light source. The connection structure between the light emitting elements LD may be variously changed according to embodiments. For example, the light emitting elements LD may be electrically connected in series or parallel to each other, or may be electrically connected in a mixed structure of series and parallel.

In FIG. 6, the first and second transistors T1 and T2 included in the pixel circuit PXC are shown as P-type transistors, but the disclosure is not limited thereto. For example, at least one of the first and second transistors T1 and T2 may be changed to an N-type transistor. For example, the pixel circuit PXC may be structured with pixel circuits of various structures and/or driving methods.

Figure 7:
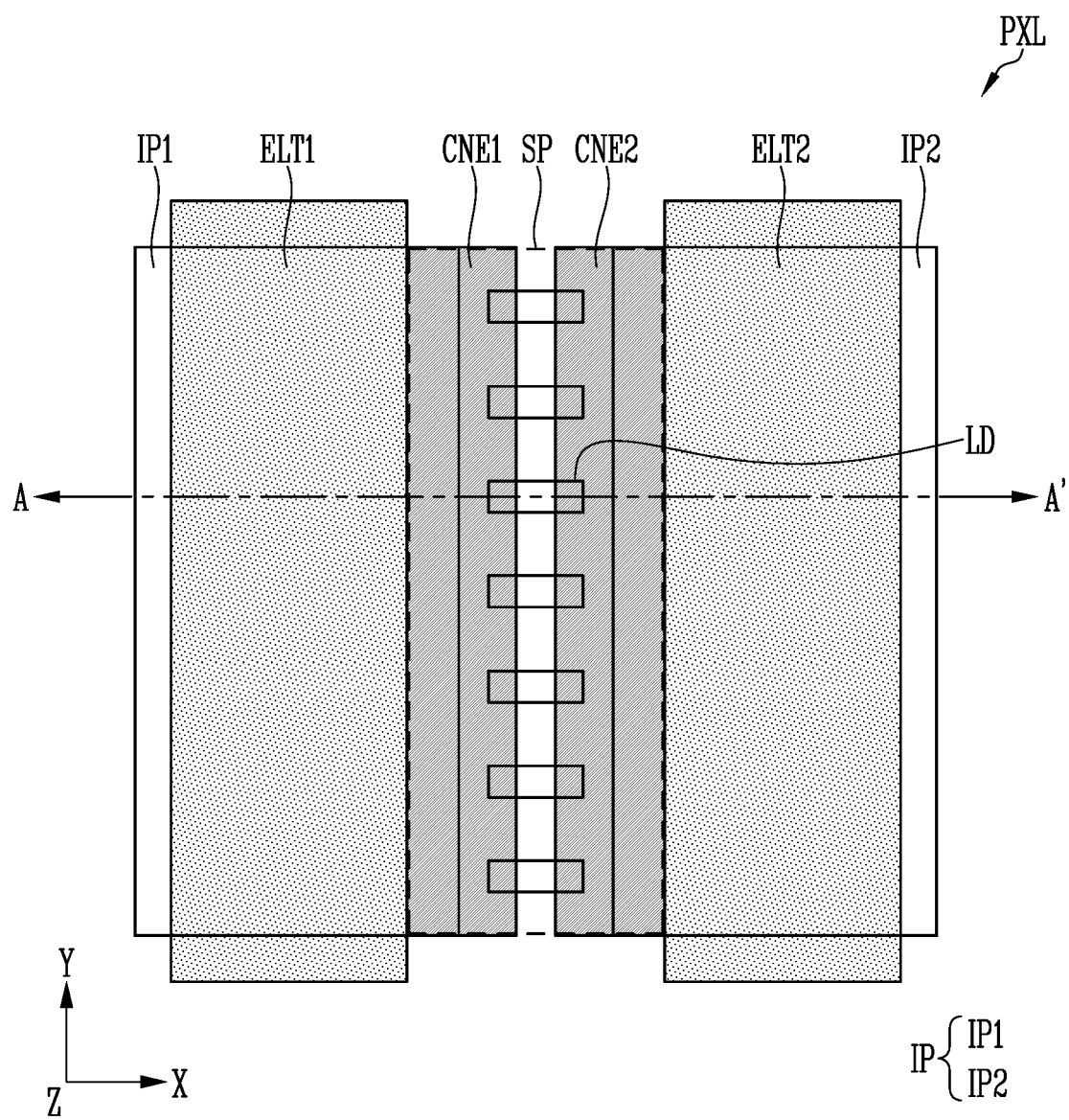
FIGS. 7 and 8 are plan views illustrating a pixel according to an embodiment.
Figure 8:
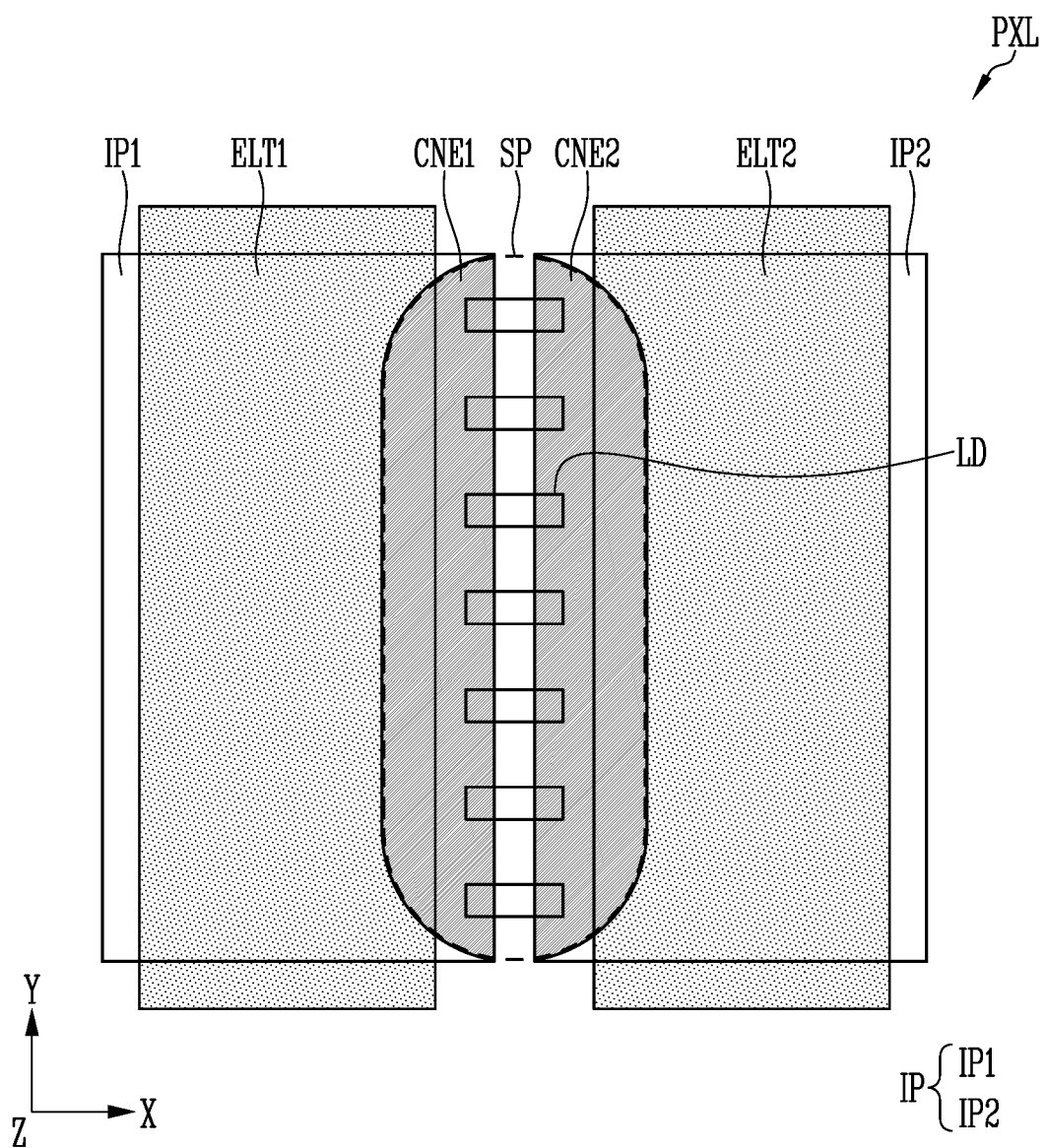
Figure 9:
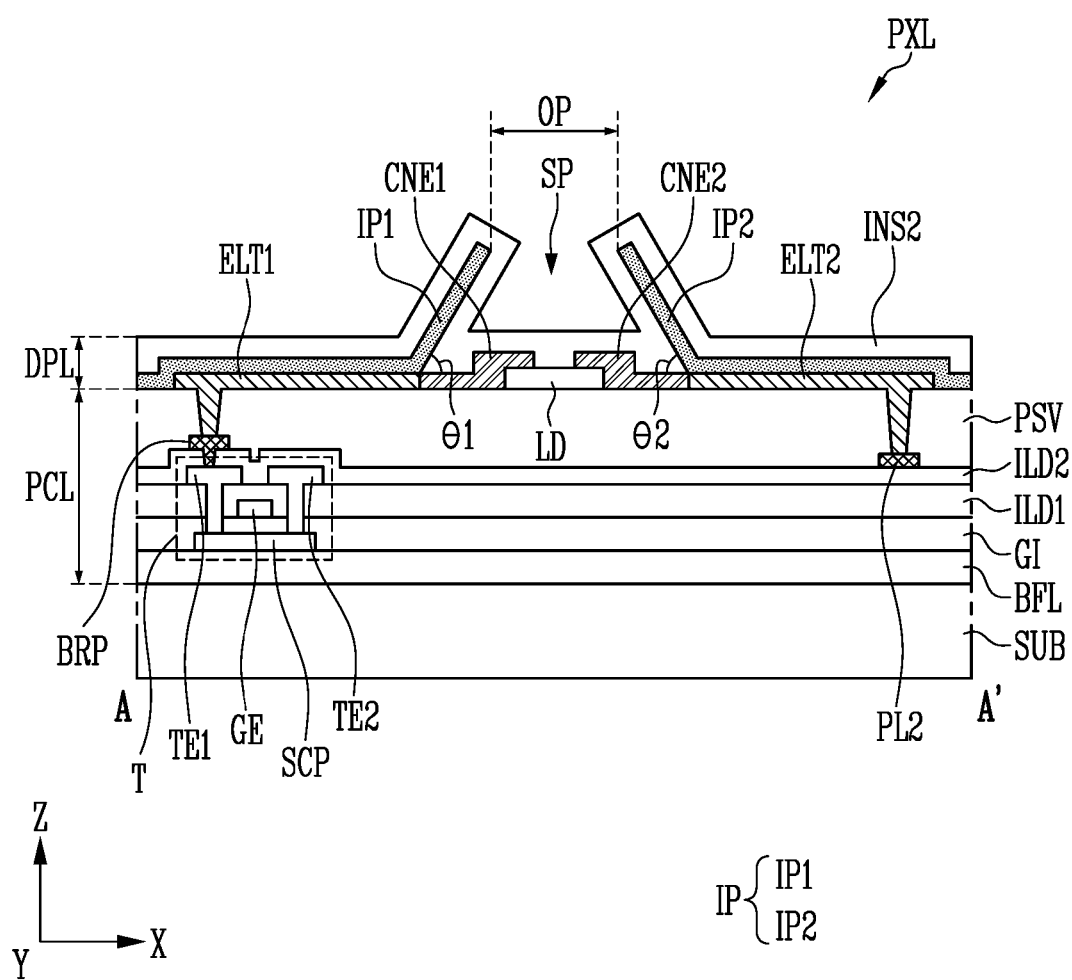
FIGS. 9 and 10 are schematic cross-sectional views taken along line A-A' of FIG. 7.
Figure 10:
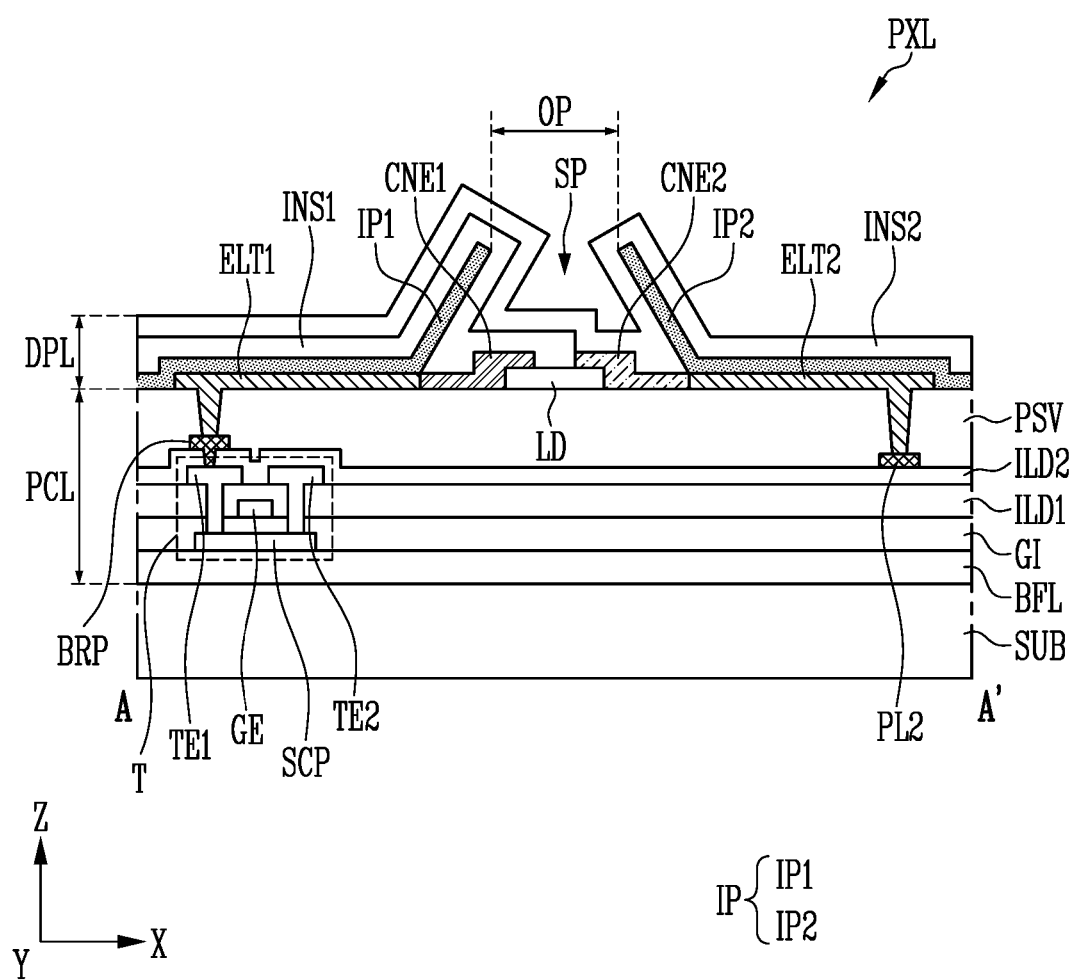

FIGS. 7 and 8 are plan views illustrating a pixel according to an embodiment. FIGS. 9 and 10 are schematic cross-sectional views taken along line A-A' of FIG. 7.

Referring to FIGS. 7 and 8, each of the pixels PXL may include the first and second electrodes ELT1 and ELT2, the light emitting elements LD, and first and second contact electrodes CNE1 and CNE2 electrically connecting the first and second electrodes ELT1 and ELT2 and the light emitting elements LD, respectively. Further, each of the pixels PXL may include an inclined pattern IP defining or forming a predetermined space SP, and the light emitting elements LD may be disposed between the first and second electrodes ELT1 and ELT2 in the space SP.

The first and second electrodes ELT1 and ELT2 may be spaced apart from each other by a predetermined interval in a first direction (X-axis direction) and may extend in a second direction (Y-axis direction). The space SP may be located between the first and second electrodes ELT1 and ELT2.

The space SP may have a substantially polygonal or substantially circular shape in a plan view. For example, as shown in FIG. 7, the space SP may have a substantially square shape having a short side extending in the first direction (X-axis direction) and a long side extending in the second direction (Y-axis direction). Edges of the first and second electrodes ELT1 and ELT2 and the first and second contact electrodes CNE1 and CNE2 adjacent to the space SP may follow a substantially planar shape of the space SP. Accordingly, the edges of the first and second electrodes ELT1 and ELT2 and the first and second contact electrodes CNE1 and CNE2 may have a substantially linear shape along the edge of the space SP.

As an example, as shown in FIG. 8, the space SP may have a substantially ellipse shape having a short axis extending in the first direction (X-axis direction) and a long axis extending in the second direction (Y-axis direction). Edges of the first and second electrodes ELT1 and ELT2 and the first and second contact electrodes CNE1 and CNE2 adjacent to the space SP may follow a substantially planar shape of the space SP. Accordingly, the edges of the first and second electrodes ELT1 and ELT2 and the first and second contact electrodes CNE1 and CNE2 may have the substantially ellipse shape along the edge of the space SP.

In FIGS. 7 and 8, cases in which the space SP has the substantially square shape or the substantially ellipse shape in a plan view are shown. However, the disclosure is not limited thereto and may be variously changed.

The first contact electrode CNE1 may electrically connect one or an end of the light emitting element LD and the first electrode ELT1. The second contact electrode CNE2 may electrically connect the other end of the light emitting element LD and the second electrode ELT2. However, the connection relationship between the first and second electrodes ELT1 and ELT2, the light emitting elements LD, and the first and second contact electrodes CNE1 and CNE2 is not limited to the structures shown in FIGS. 7 and 8. The number, location, or electrical connection relationship of the electrodes disposed in each pixel PXL may be variously changed.

Hereinafter, a cross-sectional structure of each pixel PXL will be described in detail with reference to FIGS. 9 and 10 based on the light emitting element LD. FIGS. 9 and 10 schematically show the structure of each pixel PXL based on one light emitting element LD, and show a transistor T electrically connected to the first electrode ELT1 among various circuit elements constituting the pixel circuit PXC. Hereinafter, when there is no need to specify the first transistor T1 separately, the first transistor T1 may also be referred to as "transistor T".

Structures of the transistors T and/or positions in each layer are not limited to the embodiments shown in FIGS. 9 and 10, and may be variously changed according to embodiments. In an embodiment, the transistors T constituting each pixel circuit PXC may have substantially the same or similar structure to each other, but the disclosure is not limited thereto. For example, in an embodiment, at least one of transistors T constituting the pixel circuit PXC may have a cross-sectional structure different from the other transistors T, and/or may be disposed on a different layer.

Referring to FIGS. 9 and 10, the pixel PXL and the display device including the same may include a substrate SUB, and a circuit layer PCL and a display layer DPL disposed on one or a surface of the substrate SUB. According to an embodiment, a color conversion layer and/or a color filter layer may be further disposed on the display layer DPL, but the disclosure is not limited thereto.

The circuit layer PCL may include circuit elements constituting the pixel circuit PXC of each pixel PXL and various wirings electrically connected thereto. The display layer DPL may include the electrodes (for example, the first and second electrodes ELT1 and ELT2 and/or the first and second contact electrodes CNE1 and CNE2) constituting the light source unit LSU of each pixel PXL and the light emitting elements LD.

The circuit layer PCL may include at least one circuit element electrically connected to the light emitting elements LD of each pixel PXL. For example, the circuit layer PCL may include a plurality of transistors T disposed in each pixel area and constituting the pixel circuit PXC of the corresponding pixel PXL. The circuit layer PCL may further include at least one power source line and/or signal line electrically connected to each pixel circuit PXC and/or light source unit LSU. For example, the circuit layer PCL may include the first power source line PL1, the second power source line PL2, the scan line Si and the data line Dj electrically connected to each pixel PXL.

Also, the circuit layer PCL may include a plurality of insulating layers. For example, the circuit layer PCL may include a buffer layer BFL, a gate insulating layer GI, a first interlayer insulating layer ILD1, a second interlayer insulating layer ILD2, and/or a passivation layer PSV sequentially stacked on one or a surface of the substrate SUB. The circuit layer PCL may selectively further include at least one light blocking pattern (not shown) and the like disposed under or below the transistors T in at least a portion.

The buffer layer BFL may prevent diffusion of impurities into each circuit element. The buffer layer BFL may be composed of a single layer, but may be composed of at least two or more multiple layers. In a case that the buffer layer BFL is provided as multiple layers, each layer may be formed of the same or similar material or may be formed of different materials. Various circuit elements such as the transistors T and various wirings electrically connected to the circuit elements may be disposed on the buffer layer BFL. The buffer layer BFL may be omitted according to embodiments.

Each transistor T may include a semiconductor pattern SCP (also referred to as a semiconductor layer or active layer), a gate electrode GE, and first and second transistor electrodes TE1 and TE2. In FIGS. 9 and 10, an embodiment in which each transistor T may include the first and second transistor electrodes TE1 and TE2 formed separately from the semiconductor pattern SCP is shown, but the disclosure is not limited thereto. For example, in an embodiment, the first and/or second transistor electrodes TE1 and TE2 provided or disposed in at least one transistor T may be integrated with each semiconductor pattern SCP.

The semiconductor pattern SCP may be disposed on the buffer layer BFL. For example, the semiconductor pattern SCP may be disposed between the substrate SUB on which the buffer layer BFL may be formed and the gate insulating layer GI. The semiconductor pattern SCP may include a first region in electrical contact with each first transistor electrode TE1, a second region in electrical contact with each second transistor electrode TE2, and a channel region located or disposed between the first and second regions. According to an embodiment, one of the first and second regions may be a source region and the other may be a drain region.

According to an embodiment, the semiconductor pattern SCP may be a semiconductor pattern made of polysilicon, amorphous silicon, oxide semiconductor, or the like within the spirit and the scope of the disclosure. The channel region of the semiconductor pattern SCP may be an intrinsic semiconductor as a semiconductor pattern that may not be doped with impurities, and each of the first and second regions of the semiconductor pattern SCP may be a semiconductor pattern doped with a predetermined impurity.

In an embodiment, semiconductor patterns SCP of the transistors T constituting each pixel circuit PXC may be formed of substantially the same or similar material. For example, the semiconductor patterns SCP of the transistors T may be made of the same or similar material among polysilicon, amorphous silicon, and oxide semiconductor.

In an embodiment, some or a number of the transistors T and the rest of the transistors T may include semiconductor patterns SCP made of different materials. For example, the semiconductor pattern SCP of some or a number of the transistors T may be made of polysilicon or amorphous silicon, and the semiconductor pattern SCP of the rest of the transistors T may be made of oxide semiconductor.

The gate insulating layer GI may be disposed on the semiconductor pattern SCP. As an example, the gate insulating layer GI may be disposed between the semiconductor pattern SCP and the gate electrode GE. The gate insulating layer GI may be composed of a single layer or multiple layers, and may include various types of organic or inorganic insulating materials including silicon nitride ($SiN_x$), silicon oxide ($SiO_x$), silicon oxynitride ($SiO_xN_y$), titanium oxide ($TiO_x$), aluminum oxide ($AlO_x$), or the like within the spirit and the scope of the disclosure.

The gate electrode GE may be disposed on the gate insulating layer GI. For example, the gate electrode GE may be disposed to overlap the semiconductor pattern SCP with the gate insulating layer GI interposed or disposed therebetween. In FIGS. 9 and 10, the transistor T having a top-gate structure is shown, but in an embodiment, the transistor T may have a bottom-gate structure. The gate electrode GE may be disposed under or below the semiconductor pattern SCP to overlap the semiconductor pattern SCP.

The first interlayer insulating layer ILD1 may be disposed on the gate electrode GE. For example, the first interlayer insulating layer ILD1 may be disposed between the gate electrode GE and the first and second transistor electrodes TE1 and TE2. The first interlayer insulating layer ILD1 may be composed of a single layer or multiple layers, and may include at least one inorganic insulating material and/or organic insulating material. For example, the first interlayer insulating layer ILD1 may include various types of organic or inorganic insulating materials including silicon nitride ($SiN_x$), silicon oxide ($SiO_x$), silicon oxynitride ($SiO_xN_y$), titanium oxide ($TiO_x$), aluminum oxide ($AlO_x$), or the like within the spirit and the scope of the disclosure. The material constituting the first interlayer insulating layer ILD1 is not particularly limited.

The first and second transistor electrodes TE1 and TE2 may be respectively disposed on the semiconductor pattern SCP with at least one first interlayer insulating layer ILD1 interposed or disposed therebetween. For example, the first and second transistor electrodes TE1 and TE2 may be disposed on different ends of the semiconductor pattern SCP with the gate insulating layer GI and the first interlayer insulating layer ILD1 interposed or disposed therebetween. The first and second transistor electrodes TE1 and TE2 may be electrically connected to the semiconductor patterns SCP, respectively. For example, the first and second transistor electrodes TE1 and TE2 may be electrically connected to the first and second regions of the semiconductor pattern SCP through contact holes penetrating the gate insulating layer GI and the first interlayer insulating layer ILD1, respectively. According to an embodiment, one of the first and second transistor electrodes TE1 and TE2 may be the source electrode, and the other may be the drain electrode.

At least one transistor T provided or disposed in the pixel circuit PXC may be electrically connected to at least one pixel electrode. For example, the transistor T may be electrically connected to the first electrode ELT1 of the corresponding pixel PXL through a contact hole and/or a bridge pattern BRP penetrating the passivation layer PSV.

In an embodiment, at least one signal line and/or power source line electrically connected to each pixel PXL may be disposed on the same layer as one electrode of the circuit elements constituting the pixel circuit PXC. For example, the scan line Si of each pixel PXL may be disposed on the same layer as the gate electrodes GE of the transistors T, and the data line Dj of each pixel PXL may be disposed on the same layer as the first and second transistor electrodes TE1 and TE2 of the transistors T.

The first and/or second power source lines PL1 and PL2 may be disposed on the same layer as the gate electrodes GE or the first and second transistor electrodes TE1 and TE2 of the transistors T, or may be disposed on different layers. For example, the second power source line PL2 for supplying the second power source VSS may be disposed on the second interlayer insulating layer ILD2, and at least a portion of the second power source line PL2 may be covered or overlapped by the passivation layer PSV. The second power source line PL2 may be electrically connected to the second electrode ELT2 of the light source unit LSU disposed on the passivation layer PSV through a contact hole penetrating the passivation layer PSV. However, the positions and/or structures of the first and/or second power source lines PL1 and PL2 may be variously changed. For example, the second power source line PL2 may be disposed on the same layer as the gate electrodes GE or the first and second transistor electrodes TE1 and TE2 of the transistors T, and may be electrically connected to the second electrode ELT2 through at least one bridge pattern and/or contact hole (not shown).

The second interlayer insulating layer ILD2 may be disposed on the first interlayer insulating layer ILD1 and may cover or overlap the first and second transistor electrodes TE1 and TE2 positioned or disposed on the first interlayer insulating layer ILD1. The second interlayer insulating layer ILD2 may be composed of a single layer or multiple layers, and may include at least one inorganic insulating material and/or organic insulating material. For example, the second interlayer insulating layer ILD2 may include various types of organic or inorganic insulating materials including silicon nitride ($SiN_x$), silicon oxide ($SiO_x$), silicon oxynitride ($SiO_xN_y$), titanium oxide ($TiO_x$), aluminum oxide ($AlO_x$), or the like within the spirit and the scope of the disclosure. However, the material of the second interlayer insulating layer ILD2 is not limited thereto.

The bridge pattern BRP that electrically connects at least one circuit element (for example, the first transistor T1) provided or disposed in the pixel circuit PXC to the first electrode ELT1, the first power source line PL1 and/or the second power source line PL2 may be disposed on the second interlayer insulating layer ILD2. However, the second interlayer insulating layer ILD2 may be omitted according to embodiments. The bridge pattern BRP and the like shown in FIGS. 9 and 10 may be omitted, and the second power source line PL2 may be disposed on a layer in which one electrode of the transistor T may be disposed.

The passivation layer PSV may be disposed on the circuit elements including the transistors T and/or the wirings including the first and second power source lines PL1 and PL2. The passivation layer PSV may be composed of a single layer or multiple layers, and may include at least one inorganic insulating material and/or organic insulating material. For example, the passivation layer PSV may include the organic insulating material such as polyacrylates resin, epoxy resin, phenolic resin, polyamides resin, polyimides rein, unsaturated polyesters resin, polyphenylenethers resin, polyphenylenesulfides resin, and benzocyclobutene (BCB) or a combination thereof. However, the disclosure is not limited thereto. The passivation layer PSV may include the inorganic insulating material such as silicon nitride ($SiN_x$), silicon oxide ($SiO_x$), silicon oxynitride ($SiO_xN_y$), titanium oxide ($TiO_x$), and aluminum oxide ($AlO_x$), or may be formed of an organic-inorganic composite layer.

The display layer DPL may be disposed on the passivation layer PSV of the circuit layer PCL. The display layer DPL may include the first electrode ELT1, the second electrode ELT2, and at least one light emitting element LD electrically connected between the first electrode ELT1 and the second electrode ELT2 constituting each light source unit LSU. FIGS. 9 and 10 show one light emitting element LD disposed in each pixel PXL. However, as shown in the embodiment of FIG. 4, each pixel PXL may include a plurality of light emitting elements LD electrically connected between the first and second electrodes ELT1 and ELT2. Accordingly, each embodiment will be described below assuming that the pixel PXL may include the plurality of light emitting elements LD.

The first electrode ELT1 and the second electrode ELT2 may be disposed on the passivation layer PSV. The first electrode ELT1 and the second electrode ELT2 may be respectively disposed in the pixel area where the pixel PXL may be provided or disposed and/or formed. For example, the first electrode ELT1 and the second electrode ELT2 may be spaced apart from each other at a predetermined interval in an emission region of each pixel PXL and may be disposed side by side.

According to an embodiment, the first electrode ELT1 and/or the second electrode ELT2 may have a pattern separated for each pixel PXL or a pattern commonly electrically connected to the plurality of pixels PXL. Before the process of forming the pixel PXL, for example, before alignment of the light emitting elements LD is completed, first electrodes ELT1 of the pixels PXL disposed in the display area DA may be electrically connected to each other, and second electrodes ELT2 of the pixels PXL may be electrically connected to each other. For example, before the alignment of the light emitting elements LD is completed, the first electrodes ELT1 of the pixels PXL may be formed integrally or non-integral with each other and may be electrically connected to each other, and the second electrodes ELT2 of the pixels PXL may be integral or non-integral with each other and may be electrically connected to each other. In a case that the first electrodes ELT1 or the second electrodes ELT2 of the pixels PXL are non-integrally connected to each other, the first electrodes ELT1 or the second electrodes ELT2 may be electrically connected to each other by at least one contact hole and/or bridge pattern.

In the step of aligning the light emitting elements LD, the first electrode ELT1 and/or the second electrode ELT2 may be supplied with a first alignment signal (or a first alignment voltage) and a second alignment signal (or a second alignment voltage), respectively. For example, one of the first electrode ELT1 and the second electrode ELT2 may be supplied with an alignment signal having an AC form, and the other of the first electrode ELT1 and the second electrode ELT2 may be supplied with an alignment voltage (for example, a ground voltage) having a constant voltage level. For example, in the step of aligning the light emitting elements LD, a predetermined alignment signal may be applied to the first electrode ELT1 and/or the second electrode ELT2. Accordingly, an electric field may be formed between the first electrode ELT1 and the second electrode ELT2. The light emitting elements LD supplied to each pixel area (for example, the emission region of each pixel PXL) may be self-aligned between the first electrode ELT1 and the second electrode ELT2 by the electric field. After the alignment of the light emitting elements LD is completed, at least the first electrodes ELT1 may be disconnected from each other between the pixels PXL, so that the pixels PXL may be individually driven.

The first electrode ELT1 may be electrically connected to a predetermined circuit element (for example, at least one transistor constituting the pixel circuit PXC), a power source line (for example, the first power source line PL1), and/or a signal line (for example, the scan line Si, the data line Dj, or a predetermined control line) through a contact hole penetrating the passivation layer PSV. In an embodiment, the first electrode ELT1 may be electrically connected to the bridge pattern BRP through a contact hole penetrating the passivation layer PSV, and may be electrically connected to the transistor T through this. However, the disclosure is not limited thereto, and the first electrode ELT1 may be electrically connected to or directly electrically connected to a predetermined power source line or signal line.

The second electrode ELT2 may be electrically connected to a predetermined circuit element (for example, at least one transistor constituting the pixel circuit PXC), a power source line (for example, the second power source line PL2), and/or a signal line (for example, the scan line Si, the data line Dj, or the predetermined control line) through a contact hole penetrating the passivation layer PSV. In an embodiment, the second electrode ELT2 may be electrically connected to the second power source line PL2 through a contact hole penetrating the passivation layer PSV. However, the disclosure is not limited thereto, and the second electrode ELT2 may be electrically connected to or directly electrically connected to a predetermined power source line or signal line.

In an embodiment, the first electrode ELT1 and/or the second electrode ELT2 may include at least one conductive material. For example, the first electrode ELT1 and/or the second electrode ELT2 may include at least one conductive material such as at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and alloys thereof, a conductive oxide including ITO (Indium Tin Oxide), IZO (Indium Zinc Oxide), ITZO (Indium Tin Zinc Oxide), ZnO (Zinc Oxide), AZO (Aluminum Zinc Oxide), GZO (Gallium Zinc Oxide), ZTO (Zinc Tin Oxide), GTO (Gallium Tin Oxide) and FTO (Fluorine Tin Oxide), and a conductive polymer including PEDOT, but the disclosure is not limited thereto. For example, the first electrode ELT1 and/or the second electrode ELT2 may include other conductive materials including carbon nanotubes, graphene, and the like within the spirit and the scope of the disclosure. The first electrode ELT1 and/or the second electrode ELT2 may be composed of a single layer or multiple layers, respectively. For example, the first electrode ELT1 and/or the second electrode ELT2 may include a reflective electrode layer including a reflective conductive material, respectively. The first electrode ELT1 and/or the second electrode ELT2 may further selectively include at least one of at least one transparent electrode layer disposed above and/or below the reflective electrode layer, and at least one conductive capping layer covering or overlapping an upper portion of the reflective electrode layer and/or the transparent electrode layer.

The inclined pattern IP defining or forming a predetermined space SP may be disposed on the first electrode ELT1 and/or the second electrode ELT2. The inclined pattern IP may serve to accommodate ink INK (shown in FIG. 22) in which the light emitting elements LD are included in or dispersed in a process of supplying the light emitting elements LD. Accordingly, the light emitting element LD may be selectively supplied into the space SP defined or formed by the inclined pattern IP. Therefore, a loss of the ink INK can be minimized. A detailed description thereof will be described later with reference to FIG. 22.

The inclined pattern IP may include an opening OP that at least partially overlaps the light emitting element LD. The light emitting element LD may be supplied into the space SP through the opening OP of the inclined pattern IP.

The inclined pattern IP may include a first inclined pattern IP1 disposed on the first electrode ELT1 and a second inclined pattern IP2 disposed on the second electrode ELT2. The first inclined pattern IP1 and the second inclined pattern IP2 may be spaced apart from each other with the opening OP interposed or disposed or formed therebetween.

The first inclined pattern IP1 may face one or an end of the light emitting element LD, and the second inclined pattern IP2 may face the other or another end of the light emitting element LD. In an embodiment, an inclination angle θ1 of the first inclined pattern IP1 may be substantially the same as an inclination angle θ2 of the second inclined pattern IP2. Here, the inclination angles θ1 and θ2 may mean an acute angle formed by the inclined patterns IP1 and IP2 with an upper surface of the substrate SUB. In a case that the first inclined pattern IP1 and the second inclined pattern IP2 are formed at substantially the same inclination angle, light emitted from the light emitting element LD may be uniformly reflected by the first inclined pattern IP1 and the second inclined pattern IP2, respectively.

The inclined pattern IP may include an inorganic insulating material. For example, the inclined pattern IP may include various types of inorganic insulating materials including silicon nitride ($SiN_x$), silicon oxide ($SiO_x$), silicon oxynitride ($SiO_xN_y$), titanium oxide ($TiO_x$), aluminum oxide ($AlO_x$), and the like within the spirit and the scope of the disclosure. According to an embodiment, various reflective materials may be selected as the inclined pattern IP within a range in which reflectance can be secured. In an embodiment, the inclined pattern IP may be implemented as a distributed Bragg reflector (DBR). A detailed description of this will be described later with reference to FIG. 11.

Figure 11:
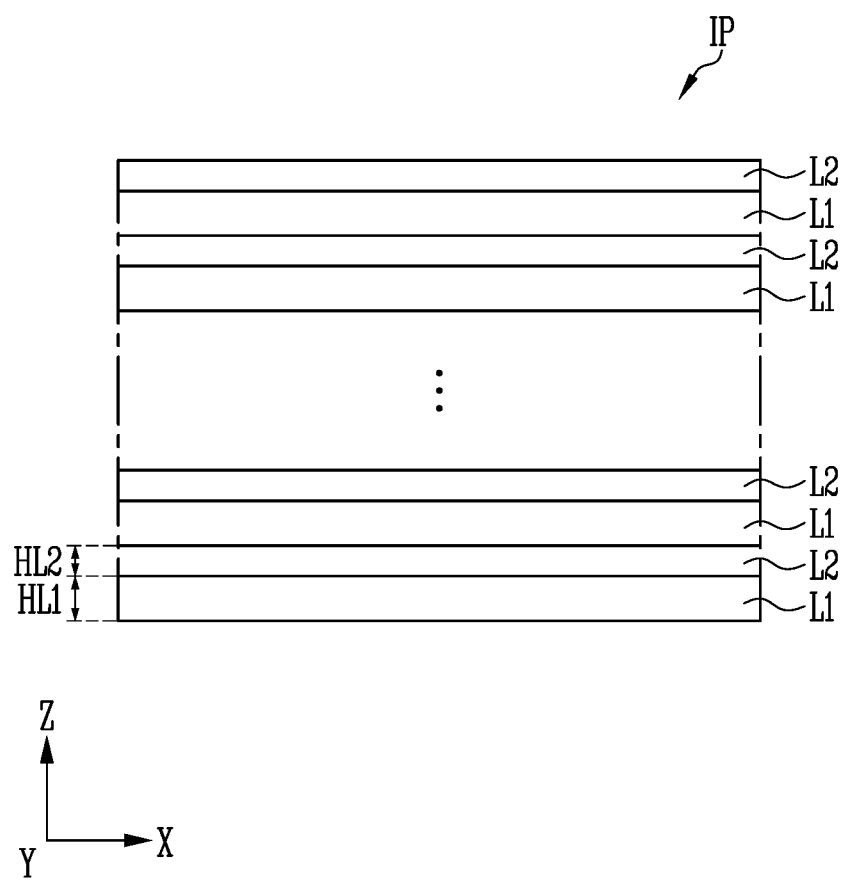
FIG. 11 is a schematic cross-sectional view illustrating an inclined pattern according to an embodiment.

FIG. 11 is a schematic cross-sectional view illustrating an inclined pattern according to an embodiment.

Referring to FIG. 11, the inclined pattern IP may include a plurality of first and second layers L1 and L2 having different refractive indices. The plurality of first and second layers L1 and L2 may be alternately stacked with each other.

The first layer L1 and the second layer L2 may include inorganic materials having different refractive indices. For example, the first layer L1 and the second layer L2 may include at least one of silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), hafnium oxide ($HfO_x$), zirconium oxide ($ZrO_x$), titanium oxide ($TiO_x$), and tantalum oxide ($TaO_x$). The inclined pattern IP may include four to ten pairs of the first layer L1 and the second layer L2, respectively, depending on the material constituting the first layer L1 and the second layer L2, however, the disclosure is not limited thereto.

Also, the first layer L1 and the second layer L2 may have different thicknesses. Here, the thickness of each layer means the thickness in a third direction (Z-axis direction). The thickness HL1 of the first layer L1 and the thickness HL2 of the second layer L2 may be adjusted according to the wavelength of the light emitted from the light emitting element LD, respectively.

In an embodiment, the first layer L1 may include silicon oxide ($SiO_x$), and the second layer L2 may include silicon nitride ($SiN_x$). The refractive index of the first layer L1 may be smaller than that of the second layer L2, and the thickness of the first layer L1 may be greater than that of the second layer L2. Further, the first layer L1 may include silicon oxide ($SiO_x$), and the second layer L2 may include titanium oxide ($TiO_x$). The refractive index of the first layer L1 may be smaller than that of the second layer L2, and the thickness of the first layer L1 may be greater than that of the second layer L2.

In a case that the inclined pattern IP may include the plurality of first and second layers L1 and L2 having different refractive indices as described above, the light emitted from the light emitting element LD may be totally reflected by the inclined pattern IP and emitted in a front direction of the display panel PNL, for example, the third direction (Z-axis direction). Accordingly, front emission efficiency in the display device can be improved.

Referring to FIGS. 9 and 10 again, the space SP defined or formed by the inclined pattern IP may be located or disposed between the first electrode ELT1 and the second electrode ELT2. The inclined pattern IP may be spaced apart from the light emitting element LD disposed below by a predetermined distance due to the space SP.

The light emitting element LD may be disposed inside of the space SP. The light emitting element LD may be disposed between the first electrode ELT1 and the second electrode ELT2 inside of the space SP. The light emitting elements LD may be supplied into the space SP and may be aligned between the first electrode ELT1 and the second electrode ELT2. For example, the light emitting elements LD may be supplied into each space SP by an inkjet method, a slit coating method, or various other methods, and may be aligned to have a directionality between the first electrode ELT1 and the second electrode ELT2 by a predetermined alignment signal (or alignment voltage) applied to each of the first electrode ELT1 and/or the second electrode ELT2.

The first contact electrode CNE1 and the second contact electrode CNE2 may be disposed on the light emitting element LD. The first contact electrode CNE1 may be disposed between one or an end of the light emitting element LD and the first electrode ELT1 to electrically connect the one or an end of the light emitting element LD and the first electrode ELT1. The second contact electrode CNE2 may be disposed between the other or another end of the light emitting element LD and the second electrode ELT2 to electrically connect the other or another end of the light emitting element LD and the second electrode ELT2. The first contact electrode CNE1 and the second contact electrode CNE2 may be disposed inside of the space SP described above.

In an embodiment, as shown in FIG. 9, the first contact electrode CNE1 and the second contact electrode CNE2 may be disposed on the same layer on one or a surface of the substrate SUB. For example, the first contact electrode CNE1 and the second contact electrode CNE2 may be formed of the same conductive layer. Since the first contact electrode CNE1 and the second contact electrode CNE2 may be simultaneously formed in the same process, a manufacturing process of the pixel PXL and the display device including the same may be simplified. In an embodiment, as shown in FIG. 10, the first contact electrode CNE1 and the second contact electrode CNE2 may be sequentially formed on different layers. A first insulating layer INS1 may be disposed between the first contact electrode CNE1 and the second contact electrode CNE2. The order in which the first contact electrode CNE1 and the second contact electrode CNE2 are formed may be changed according to embodiments.

The first contact electrode CNE1 and/or the second contact electrode CNE2 may be made of various transparent conductive materials. For example, the first contact electrode CNE1 and/or the second contact electrode CNE2 may include at least one of various transparent conductive materials such as ITO (Indium Tin Oxide), IZO (Indium Zinc Oxide), ITZO (Indium Tin Zinc Oxide), ZnO (Zinc Oxide), AZO (Aluminum Zinc Oxide), GZO (Gallium Zinc Oxide), ZTO (Zinc Tin Oxide), GTO (Gallium Tin Oxide), and FTO (Fluorine Tin Oxide), and may be implemented to be substantially transparent or translucent to satisfy a predetermined light transmittance. Accordingly, the light emitted from the light emitting elements LD may pass through the first contact electrode CNE1 and the second contact electrode CNE2 and may be emitted to the outside the display panel PNL.

The first insulating layer INS1 may be disposed between the first contact electrode CNE1 and the second contact electrode CNE2. In a case that the first insulating layer INS1 is formed or disposed between the first contact electrode CNE1 and the second contact electrode CNE2, electrical stability between the ends of the light emitting elements LD can be ensured. For example, the first contact electrode CNE1 and the second contact electrode CNE2 may be stably separated by the first insulating layer INS1. Accordingly, short circuit defects between the ends of the light emitting elements LD can be effectively prevented.

The first insulating layer INS1 may be composed of a single layer or multiple layers, and may include at least one inorganic insulating material and/or organic insulating material. For example, the first insulating layer INS1 may include various types of insulating materials such as silicon nitride ($SiN_x$), silicon oxide ($SiO_x$), silicon oxynitride ($SiO_xN_y$), titanium oxide ($TiO_x$), and aluminum oxide ($AlO_x$).

A second insulating layer INS2 may be disposed on the first contact electrode CNE1 and/or the second contact electrode CNE2. For example, the second insulating layer INS2 may cover or overlap the first and second electrodes ELT1 and ELT2, the inclined pattern IP, the light emitting element LD, and the first and second contact electrodes CNE1 and CNE2. For example, the second insulating layer INS2 may cover or overlap or directly cover or overlap the first and second electrodes ELT1 and ELT2, the inclined pattern IP, the light emitting element LD, and/or the first and second contact electrodes CNE1 and CNE2. In an embodiment, the second insulating layer INS2 may cover or overlap or directly cover or overlap the inclined pattern IP inside of the space SP. The second insulating layer INS2 may cover or overlap or directly cover or overlap the light emitting element LD, the first contact electrode CNE1 and/or the second contact electrode CNE2 inside of the space SP, but the disclosure is not limited thereto.

In an embodiment, the second insulating layer INS2 may be formed to have a substantially uniform thickness. For example, the second insulating layer INS2 inside of the space SP and the second insulating layer INS2 outside of the space SP may have substantially the same thickness. For example, in a case that the second insulating layer INS2 is formed by the atomic layer deposition method, since the step coverage is excellent, the second insulating layer INS2 inside of the space SP and the second insulating layer INS2 outside of the space SP may have substantially the same thickness. However, the disclosure is not limited thereto. The second insulating layer INS2 inside of the space SP may be formed to be thinner than the second insulating layer INS2 outside of the space SP. For example, in a case that the second insulating layer INS2 is formed by the chemical vapor deposition method, since the step coverage is low, the second insulating layer INS2 inside of the space SP may be formed relatively thin.

The second insulating layer INS2 may include at least one or a layer of an inorganic layer and/or organic layer. The second insulating layer INS2 may be composed of a single layer or multiple layers, and may include at least one inorganic insulating material and/or organic insulating material. For example, the second insulating layer INS2 may include various types of organic and/or inorganic insulating materials such as silicon nitride ($SiN_x$), silicon oxide ($SiO_x$), silicon oxynitride ($SiO_xN_y$), titanium oxide ($TiO_x$), and aluminum oxide ($AlO_x$).

In an embodiment, the second insulating layer INS2 may include a thin film encapsulation layer having a multilayer structure. For example, the second insulating layer INS2 may be composed of the thin film encapsulation layer having the multilayer structure including at least two inorganic insulating layers and at least one organic insulating layer interposed or disposed between the at least two inorganic insulating layers. However, the disclosure is not limited thereto. The material and/or structure of the second insulating layer INS2 may be variously changed. Although not shown, each of the pixels PXL may further include a color conversion layer and/or a color filter layer disposed on the second insulating layer INS2. For example, the color conversion layer and/or the color filter layer may be formed or disposed on the light emitting element LD inside of the space SP. The color conversion layer and/or the color filter layer may be provided or disposed inside of the space SP and may be disposed on or directly disposed on the light emitting element LD. However, the disclosure is not limited thereto. The color conversion layer and/or the color filter layer may be formed as a separate layer or substrate and provided or disposed on the display layer DPL.

According to the display device according to an embodiment described above, the light emitting element LD may be accommodated in the space SP defined or formed by the inclined pattern IP in the process of supplying the light emitting element LD to each pixel PXL. For example, the light emitting element LD may be selectively supplied into the space SP. Therefore, loss of material may be minimized and manufacturing cost may be reduced.

The light emitted from the light emitting element LD may be totally reflected by the inclined pattern IP and emitted in the front direction of the display panel PNL, for example, in the third direction (Z-axis direction). Accordingly, the efficiency of front emission in the display device can be improved.

Hereinafter, other embodiments will be described. In the following embodiments, the same components as those already described are referred to by the same reference numerals, and duplicate descriptions will be omitted or simplified.

Figure 12:
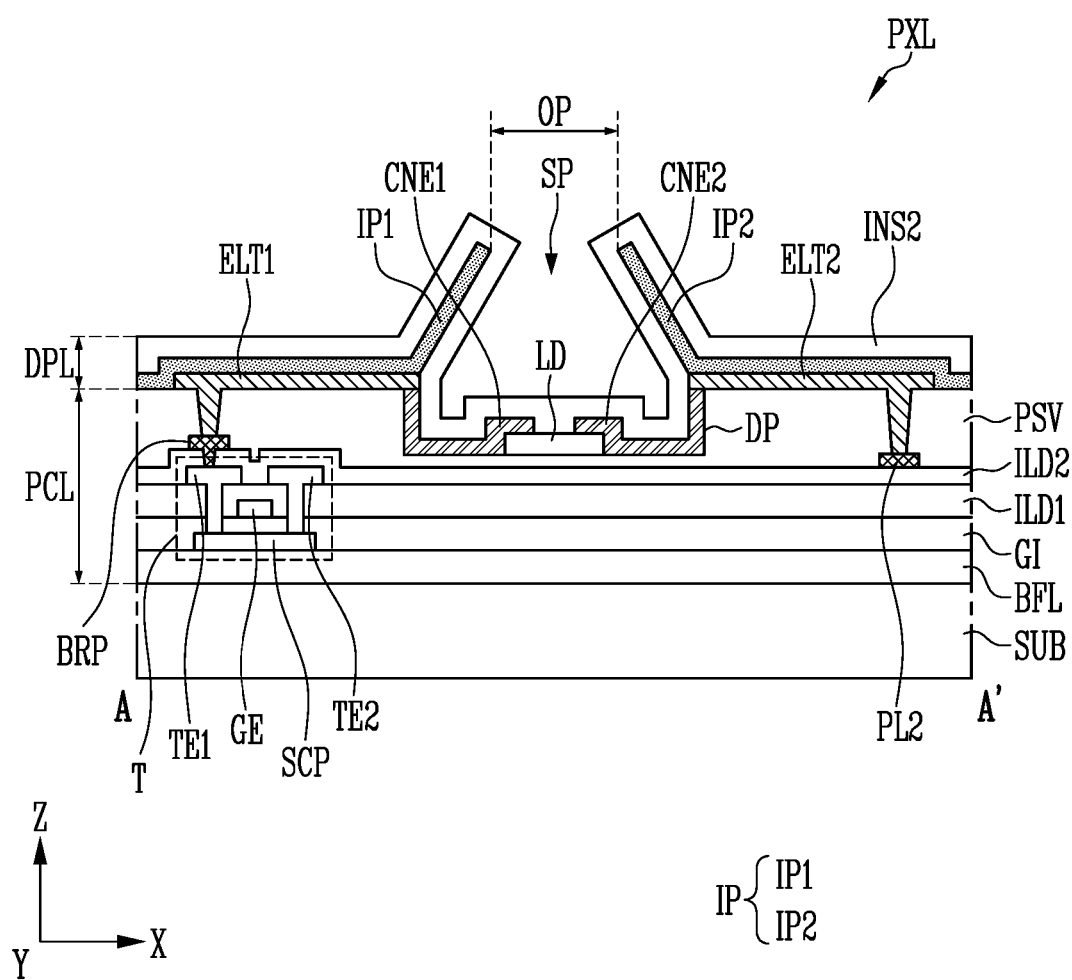
FIG. 12 is a schematic cross-sectional view illustrating a pixel according to an embodiment.

FIG. 12 is a schematic cross-sectional view illustrating a pixel according to an embodiment.

Referring to FIG. 12, a display device according to an embodiment may be different from embodiments of FIGS. 1 to 11 in that the passivation layer PSV may include a recessed portion DP.

By way of example, the recessed portion DP may be recessed in a direction opposite to the third direction (Z-axis direction) from one or a surface of the passivation layer PSV. For example, the recessed portion DP may be an area in which the passivation layer PSV is partially removed by over etching in the process of forming the space SP by removing a bank pattern BNP (shown in FIG. 20).

The light emitting element LD may be disposed on the recessed portion DP. The light emitting element LD may be disposed on the recessed portion DP in the space SP and disposed between the first electrode ELT1 and the second electrode ELT2.

The first and second contact electrodes CNE1 and CNE2 may be disposed on the light emitting element LD. The first and second contact electrodes CNE1 and CNE2 may be formed along the inner wall of the recessed portion DP to electrically connect the light emitting element LD and the first and second electrodes ELT1 and ELT2, respectively. For example, the first contact electrode CNE1 may be disposed between one or an end of the light emitting element LD and the first electrode ELT1 to electrically connect the end of the light emitting element LD and the first electrode ELT1. The second contact electrode CNE2 may be disposed between the other or another end of the light emitting element LD and the second electrode ELT2 to electrically connect the other or another end of the light emitting element LD and the second electrode ELT2.

Figure 13:
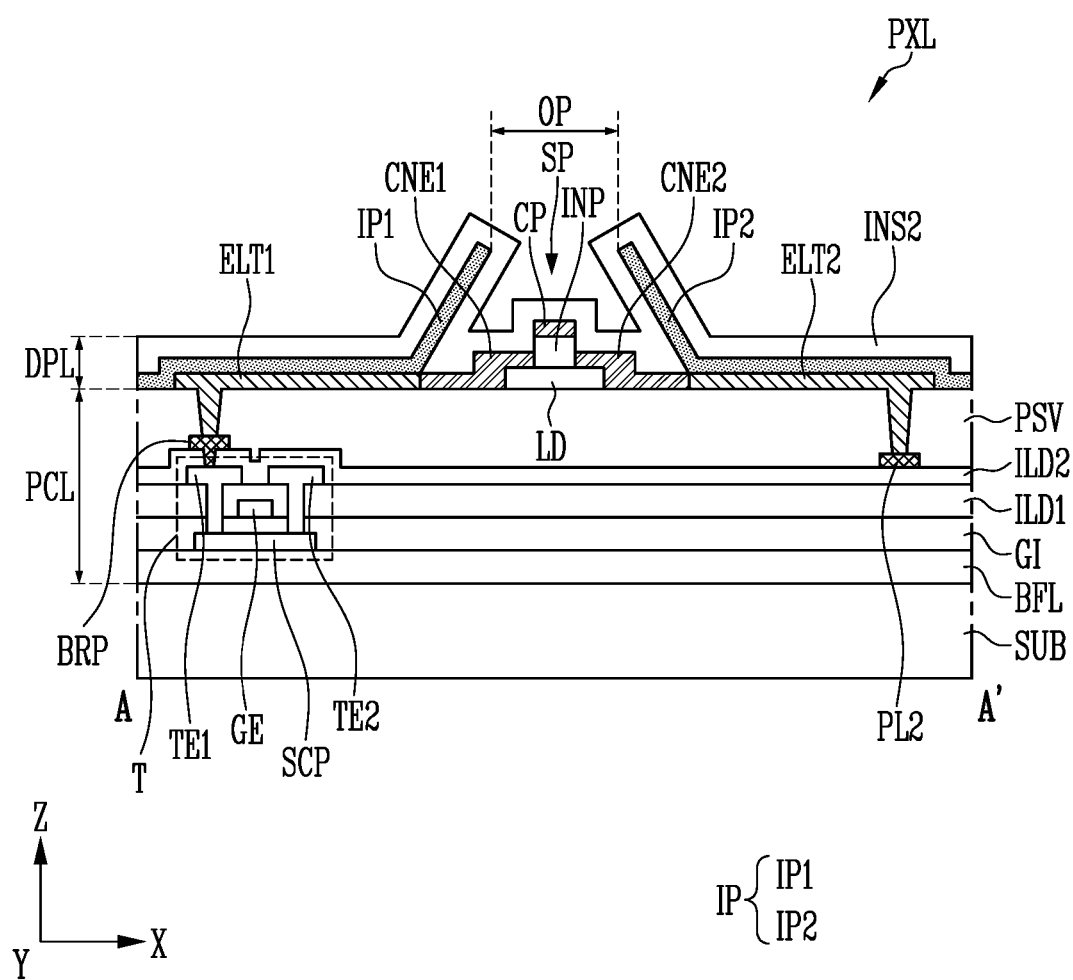
FIG. 13 is a schematic cross-sectional view illustrating a pixel according to an embodiment.

The light emitting element LD may be selectively supplied into the space SP defined or formed by the inclined pattern IP. Therefore, the loss of material may be minimized and the manufacturing cost may be reduced as described above. FIG. 13 is a schematic cross-sectional view illustrating a pixel according to an embodiment.

Referring to FIG. 13, a display device according to an embodiment may be different from embodiments of FIGS. 1 to 11 in that an insulating pattern INP and a conductive pattern CP may be further disposed on the light emitting element LD.

By way of example, the insulating pattern INP may be disposed on the light emitting elements LD. For example, the insulating pattern INP may be partially disposed on only one or an area including a central area of each of the light emitting elements LD while exposing one or an end and the other or another end of the light emitting elements LD. The insulating pattern INP may be formed as an independent pattern. The insulating pattern INP may be composed of a single layer or multiple layers, and may include at least one inorganic insulating material and/or organic insulating material. For example, the insulating pattern INP may include various types of organic or inorganic insulating materials such as silicon nitride ($SiN_x$), silicon oxide ($SiO_x$), silicon oxynitride ($SiO_xN_y$), titanium oxide ($TiO_x$), and aluminum oxide ($AlO_x$). The insulating pattern INP may prevent short circuits of the contact electrodes CNE1 and CNE2, thereby stably securing electrical contact between the light emitting element LD and the contact electrodes CNE1 and CNE2. A recessed portion may be partially included on one or a surface of the insulating pattern INP. The recessed portion may be formed by dry etching, but the disclosure is not limited thereto. In a case that the insulating pattern INP is formed or disposed on the light emitting elements LD after the alignment of the light emitting elements LD is completed, separation of the light emitting elements LD from the aligned position may be prevented.

The conductive pattern CP may be disposed on the insulating pattern INP. The conductive pattern CP may be formed simultaneously with the first contact electrode CNE1 and/or the second contact electrode CNE2 described above. For example, the conductive pattern CP may be made of the same or similar material as the first contact electrode CNE1 and/or the second contact electrode CNE2. In a case that the conductive pattern CP, the first contact electrode CNE1 and/or the second contact electrode CNE2 are formed at the same time, the first contact electrode CNE1 and the second contact electrode CNE2 may be separated from each other by the insulating pattern INP, and may be disposed on one or a side and the other or another side of the insulating pattern INP, respectively. For example, the first contact electrode CNE1 and the second contact electrode CNE2 may be spaced apart from each other with the insulating pattern INP interposed or interposed therebetween. The first contact electrode CNE1 may be disposed on one or a side of the insulating pattern INP and may electrically contact the first electrode ELT1 and one or an end of the light emitting element LD. The second contact electrode CNE2 may be disposed on the other or another side of the insulating pattern INP and may electrically contact the second electrode ELT2 and the other or another end of the light emitting element LD. As described above, in a case that the conductive pattern CP, the first contact electrode CNE1 and/or the second contact electrode CNE2 are formed at the same time, the number of masks may be reduced and a manufacturing process of the display device may be simplified. Even if the first contact electrode CNE1 and the second contact electrode CNE2 are formed at the same time, the first contact electrode CNE1 and the second contact electrode CNE2 may be separated by the insulating pattern INP. Therefore, a short circuit between the first contact electrode CNE1 and the second contact electrode CNE2 can be prevented.

Figure 14:
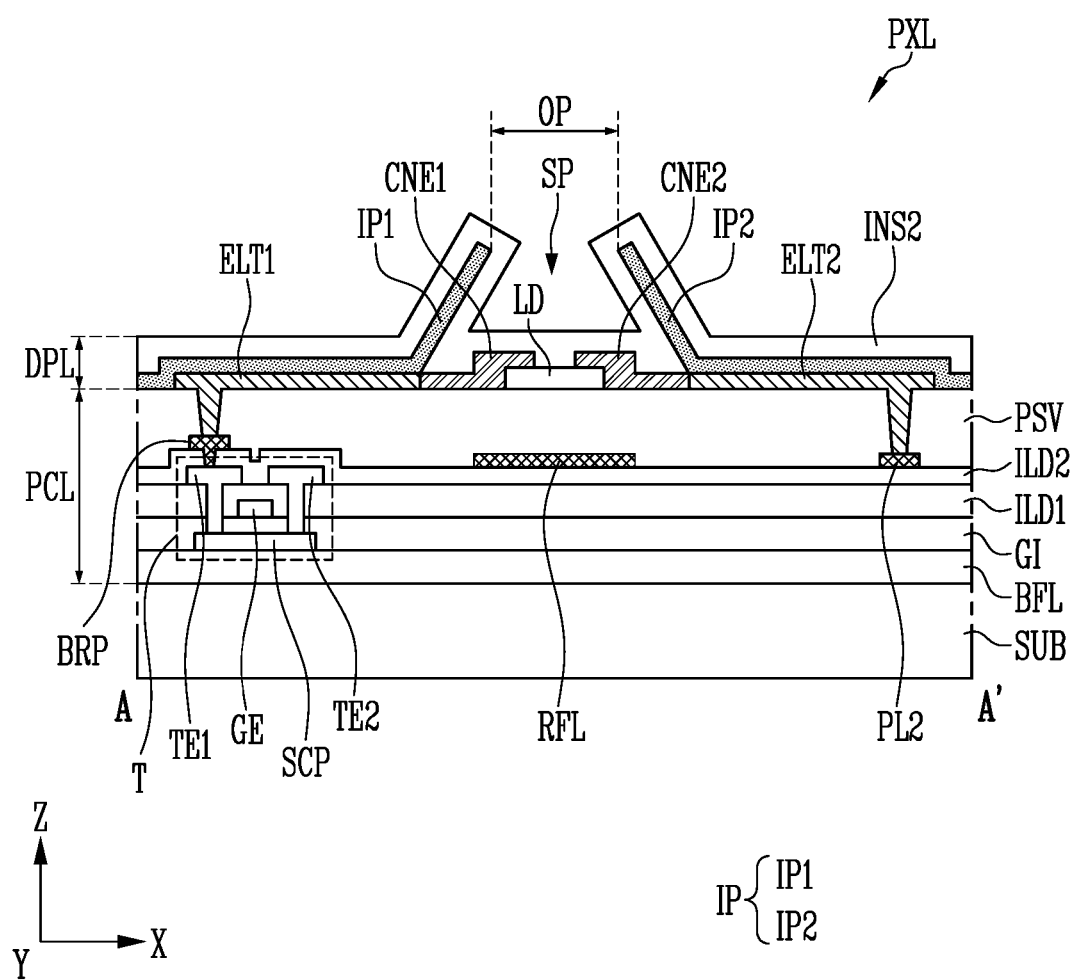
FIG. 14 is a schematic cross-sectional view illustrating a pixel according to an embodiment.

FIG. 14 is a schematic cross-sectional view illustrating a pixel according to an embodiment.

Referring to FIG. 14, a display device according to an embodiment may be different from embodiments of FIGS. 1 to 11 in that the display device may further include a reflective layer RFL disposed under or below the light emitting element LD.

By way of example, the reflective layer RFL may be disposed to overlap the light emitting element LD in the third direction (Z-axis direction). For example, the reflective layer RFL may be disposed to overlap the both ends of the light emitting element LD. In this way, as the reflective layer RFL overlaps the light emitting element LD in the third direction (Z-axis direction), the light emitted from the light emitting element LD may be reflected by the reflective layer RFL disposed under or below the light emitting element LD, and may be emitted in the front direction of the display panel PNL, for example, in the third direction (Z-axis direction). Accordingly, the amount of light lost to the lower portion of the display panel PNL may be minimized, so that the efficiency of front emission can be improved.

The reflective layer RFL may be formed of an opaque metal or a conductive material having a uniform reflectance. For example, the reflective layer RFL may include at least one of metals such as aluminum (Al), magnesium (Mg), silver (Ag), molybdenum (Mo), platinum (Pt), palladium (Pd), gold (Au), nickel (Ni), neodymium (Nd), iridium (Ir), chromium (Cr), and alloys thereof, but the disclosure is not limited thereto.

In an embodiment, the reflective layer RFL may be formed of the same conductive layer as the bridge pattern BRP and/or the second power source line PL2. However, the disclosure is not limited thereto, and the reflective layer RFL may be formed of the same conductive layer as the gate electrode GE or the first and second transistor electrodes TE1 and TE2.

Figure 15:
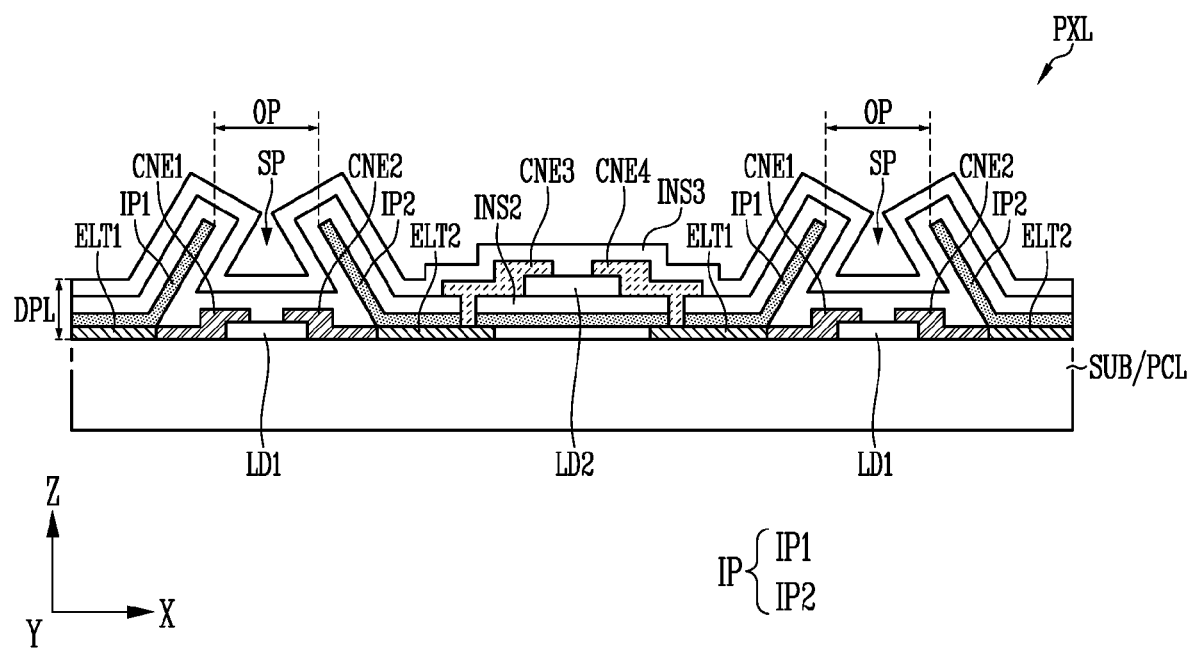
FIG. 15 is a schematic cross-sectional view illustrating a pixel according to an embodiment.

FIG. 15 is a schematic cross-sectional view illustrating a pixel according to an embodiment.

Referring to FIG. 15, a display device according to an embodiment may be different from embodiments of FIGS. 1 to 11 in that the display device may include a first light emitting element LD1 disposed inside of the space SP and a second light emitting element LD2 disposed outside of the space SP. In FIG. 15, the circuit layer PCL may be omitted for convenience of description.

By way of example, the first light emitting element LD1 may be disposed between the first electrode ELT1 and the second electrode ELT2 inside of the space SP. Since the first light emitting element LD1 of an embodiment may be substantially the same as or similar to the light emitting element LD described with reference to FIGS. 1 to 11, duplicate descriptions will be omitted.

The second light emitting element LD2 may be disposed on the inclined pattern IP outside of the space SP. The second light emitting element LD2 may be disposed between two adjacent spaces SP. The second light emitting element LD2 may be disposed between the first electrode ELT1 and the second electrode ELT2 adjacent to each other outside of the space SP.

The light emitting elements LD may be supplied to the outside of the space SP and may be aligned between the first electrode ELT1 and the second electrode ELT2. For example, the light emitting elements LD may be supplied to the outside of each space SP by an inkjet method, a slit coating method, or other various methods, and may be aligned to have a directionality between the first electrode ELT1 and the second electrode ELT2 by a predetermined alignment signal (or alignment voltage) applied to each of the first electrode ELT1 and/or the second electrode ELT2. The second insulating layer INS2 described above may be further disposed between the inclined pattern IP and the second light emitting element LD2.

A third contact electrode CNE3 and a fourth contact electrode CNE4 may be disposed on the second light emitting element LD2. The third contact electrode CNE3 may be disposed between one or an end of the second light emitting element LD2 and the second electrode ELT2 to electrically connect the one end of the second light emitting element LD2 and the second electrode ELT2. The third contact electrode CNE3 may be electrically connected to the second electrode ELT2 through the inclined pattern IP and/or a contact hole penetrating the second insulating layer INS2. The fourth contact electrode CNE4 may be disposed between the other end of the second light emitting element LD2 and the first electrode ELT1 to electrically connect the other end of the second light emitting element LD2 and the first electrode ELT1. The fourth contact electrode CNE4 may be electrically connected to the first electrode ELT1 through the inclined pattern IP and/or a contact hole penetrating the second insulating layer INS2.

The third contact electrode CNE3 and/or the fourth contact electrode CNE4 may be made of various transparent conductive materials. For example, the third contact electrode CNE3 and/or the fourth contact electrode CNE4 may include at least one of various transparent conductive materials such as ITO (Indium Tin Oxide), IZO (Indium Zinc Oxide), ITZO (Indium Tin Zinc Oxide), ZnO (Zinc Oxide), AZO (Aluminum Zinc Oxide), GZO (Gallium Zinc Oxide), ZTO (Zinc Tin Oxide), GTO (Gallium Tin Oxide), and FTO (Fluorine Tin Oxide), and may be implemented to be substantially transparent or translucent to satisfy a predetermined light transmittance. Accordingly, light emitted from the second light emitting element LD may pass through the third contact electrode CNE3 and the fourth contact electrode CNE4 and may be emitted to the outside the display panel PNL.

A third insulating layer INS3 may be disposed on the third contact electrode CNE3 and/or the fourth contact electrode CNE4. For example, the third insulating layer INS3 may be disposed on the entire surface of the substrate SUB to cover or overlap the first and second electrodes ELT1 and ELT2, the inclined pattern IP, the first light emitting element LD1, the second light emitting element LD2, and the first to fourth contact electrodes CNE1, CNE2, CNE3, and CNE4. For example, the third insulating layer INS3 may cover or overlap or directly cover or overlap the elements disposed inside of the space SP as well as outside of the space SP.

The third insulating layer INS3 may include at least one inorganic layer and/or organic layer. The third insulating layer INS3 may be composed of a single layer or multiple layers, and may include at least one inorganic insulating material and/or organic insulating material. For example, the third insulating layer INS3 may include various types of organic or inorganic insulating materials such as silicon nitride ($SiN_x$), silicon oxide ($SiO_x$), silicon oxynitride ($SiO_xN_y$), titanium oxide ($TiO_x$), and aluminum oxide ($AlO_x$).

In an embodiment, the third insulating layer INS3 may include a thin film encapsulation layer having a multilayer structure. For example, the third insulating layer INS3 may be composed of the thin film encapsulation layer having the multilayer structure including at least two inorganic insulating layers and at least one organic insulating layer interposed or disposed between the at least two inorganic insulating layers. However, the disclosure is not limited thereto, and the material and/or structure of the third insulating layer INS3 may be variously changed.

Subsequently, a method of manufacturing the display device according to the above-described embodiments will be described.

FIGS. 16 to 23 are schematic cross-sectional views illustrating process steps of a method of manufacturing a display device according to an embodiment. FIGS. 16 to 23 are schematic cross-sectional views illustrating a method of manufacturing the display device of FIG. 9, and components that are substantially the same as those of FIG. 9 are denoted by the same reference numerals and detailed descriptions may be omitted.

Figure 16:
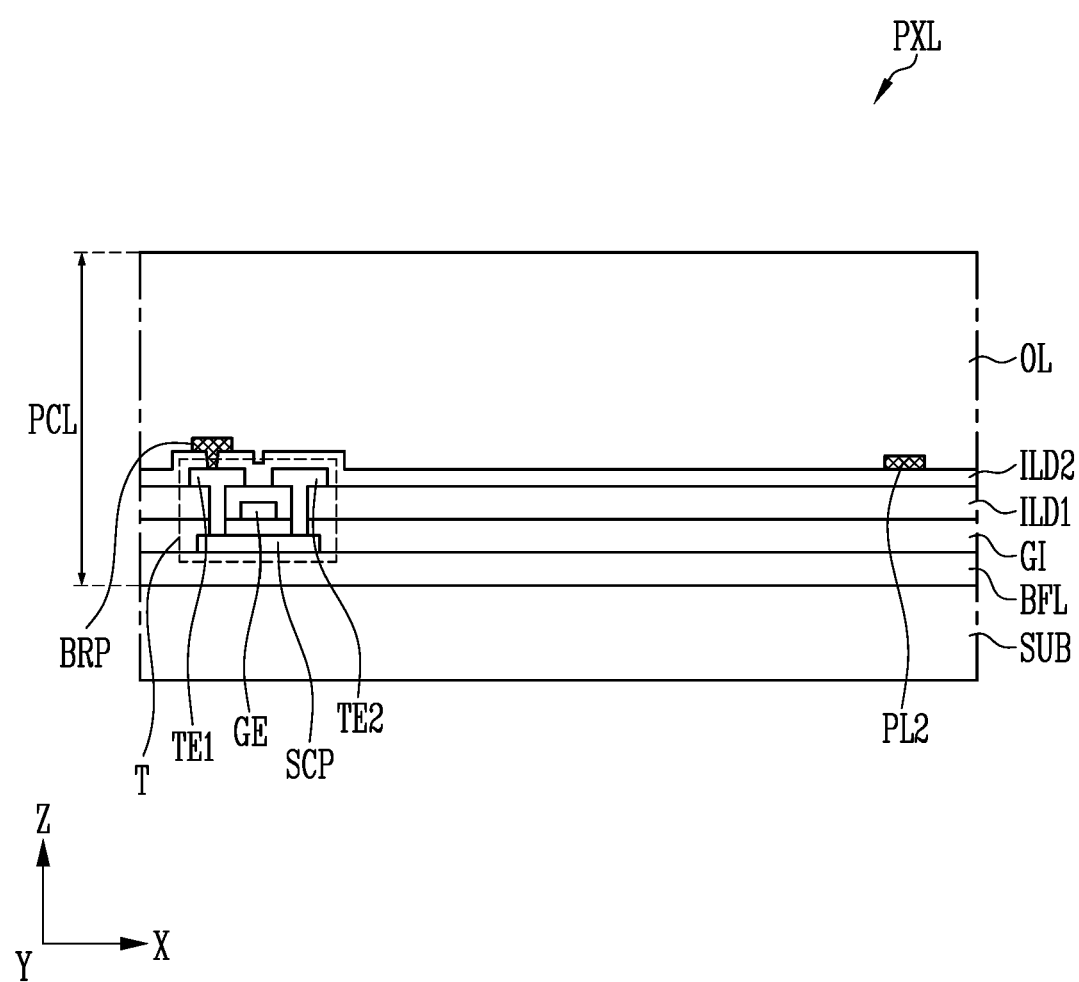
FIGS. 16 to 23 are schematic cross-sectional views illustrating process steps of a method of manufacturing a display device according to an embodiment.

Referring to FIG. 16, first, a substrate SUB on which the above-described transistor T or the like is formed may be prepared, and an organic layer OL may be formed on the substrate SUB on which a plurality of pixels PXL are respectively defined. The organic layer OL may include an organic insulating material such as polyacrylates resin, epoxy resin, phenolic resin, polyamides resin, polyimides resin, unsaturated polyesters resin, polyphenylenethers resin, polyphenylenesulfides resin, and benzocyclobutene (BCB).

Figure 17:
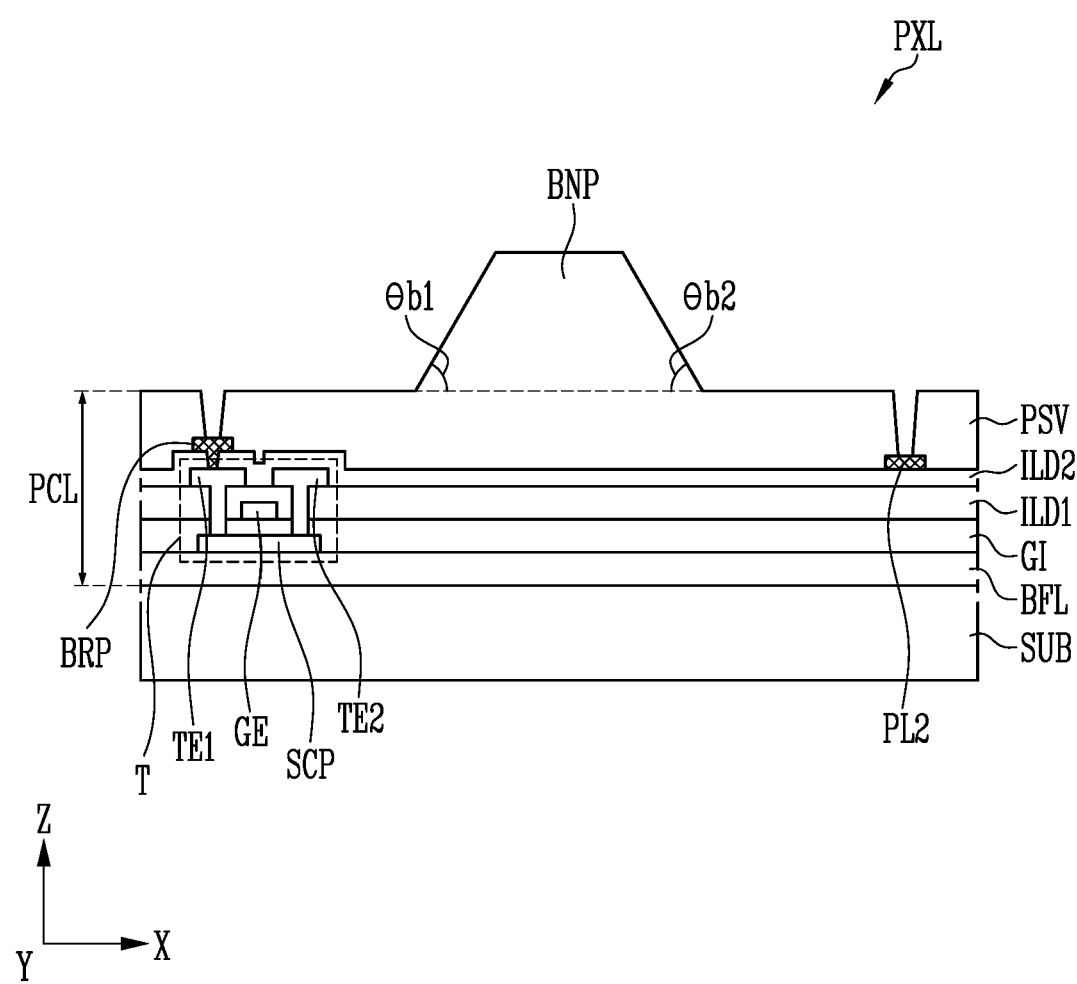

Referring to FIG. 17, subsequently, the organic layer OL may be patterned to form a passivation layer PSV and a bank pattern BNP. In an embodiment, the passivation layer PSV and the bank pattern BNP may be simultaneously formed using a halftone mask. As the passivation layer PSV and the bank pattern BNP are simultaneously formed, the number of masks may be reduced and the manufacturing process may be simplified. Inclined surfaces of the bank pattern BNP facing each other may have substantially the same inclination angle. For example, a first inclination angle $\theta b1$ of one or a side of the bank pattern BNP may be substantially the same as a second inclination angle $\theta b2$ of the other or another side of the bank pattern BNP. Here, the first and second inclination angles $\theta b1$ and $\theta b2$ may mean an acute angle formed by one or a side and the other or another side of the bank pattern BNP with an upper surface of the substrate SUB, respectively.

Figure 18:
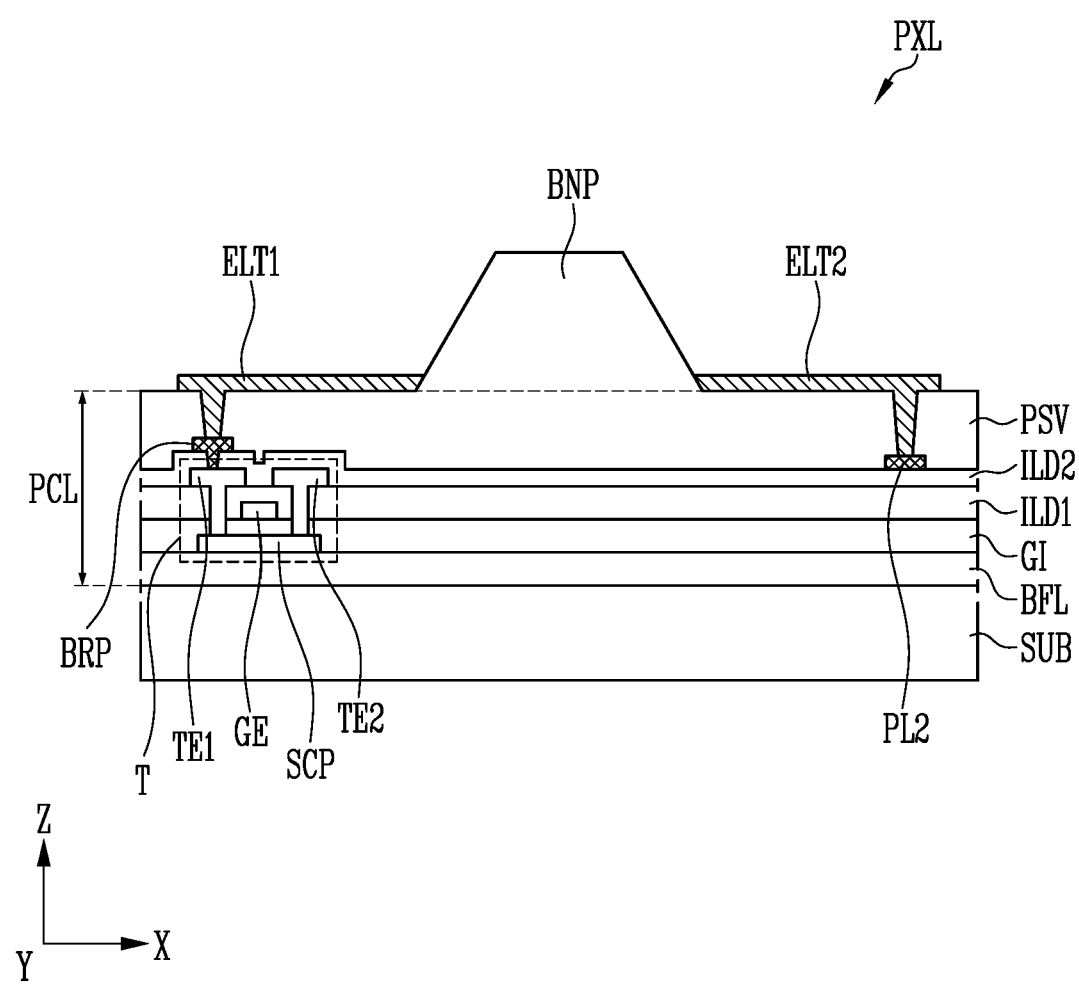

Referring to FIG. 18, subsequently, a first electrode ELT1 and a second electrode ELT2 may be provided or disposed on the passivation layer PSV. The first electrode ELT1 and the second electrode ELT2 may be formed to be spaced apart from each other with the bank pattern BNP interposed or disposed therebetween. For example, the first electrode ELT1 may be formed on one or a side of the bank pattern BNP, and the second electrode ELT2 may be formed on the other or another side of the bank pattern BNP.

Figure 19:
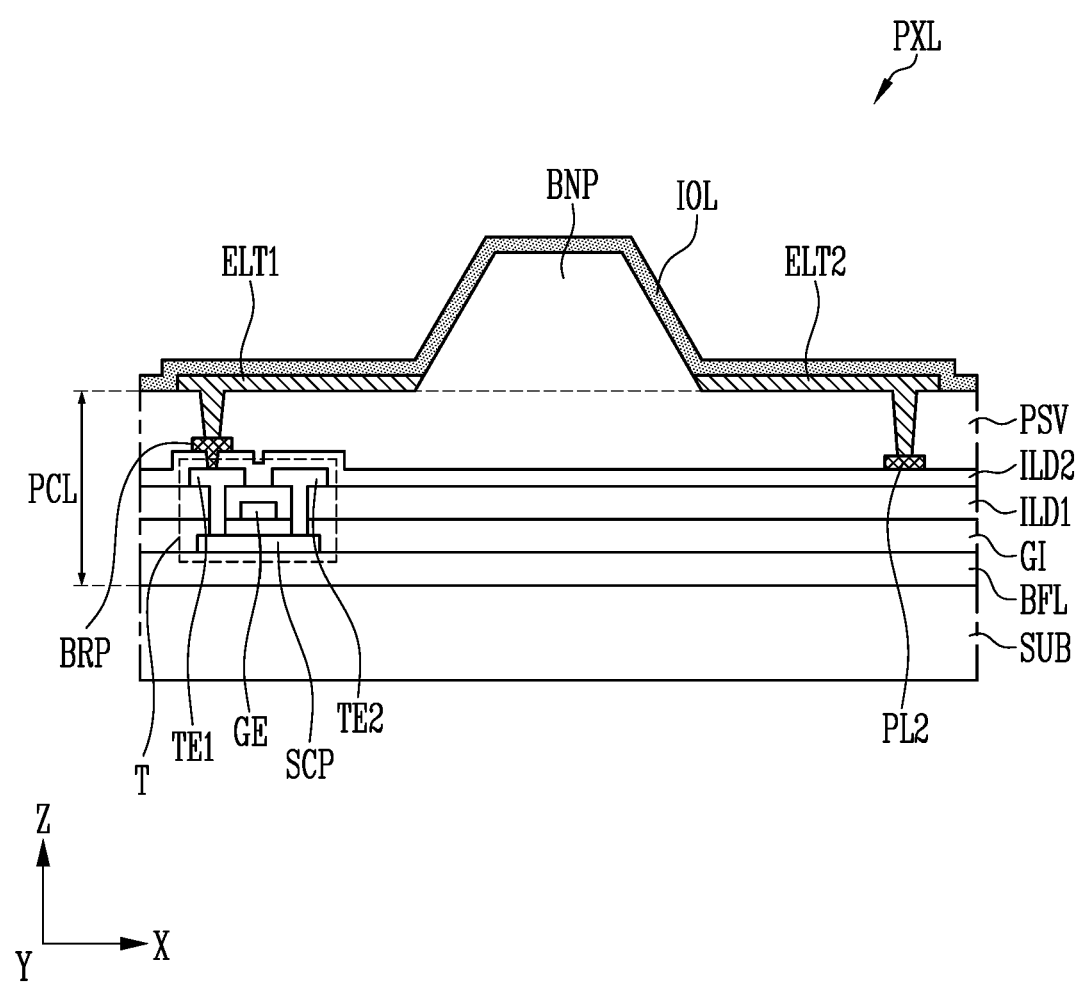

Referring to FIG. 19, subsequently, an inorganic layer IOL may be provided or disposed on the bank pattern BNP. The inorganic layer IOL may be formed or disposed on the entire surface of the substrate SUB and may also be formed or disposed on the first electrode ELT1 and/or the second electrode ELT2. As described above, the inorganic layer IOL may include a plurality of first and second layers L1 and L2 having different refractive indices. The plurality of first and second layers L1 and L2 may be alternately stacked alternately with each other. The first layer L1 and the second layer L2 may include inorganic materials having different refractive indices. For example, the first layer L1 and the second layer L2 may include at least one of silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), hafnium oxide ($HfO_x$), zirconium oxide ($ZrO_x$), titanium oxide ($TiO_x$), and tantalum oxide ($TaO_x$).

Figure 20:
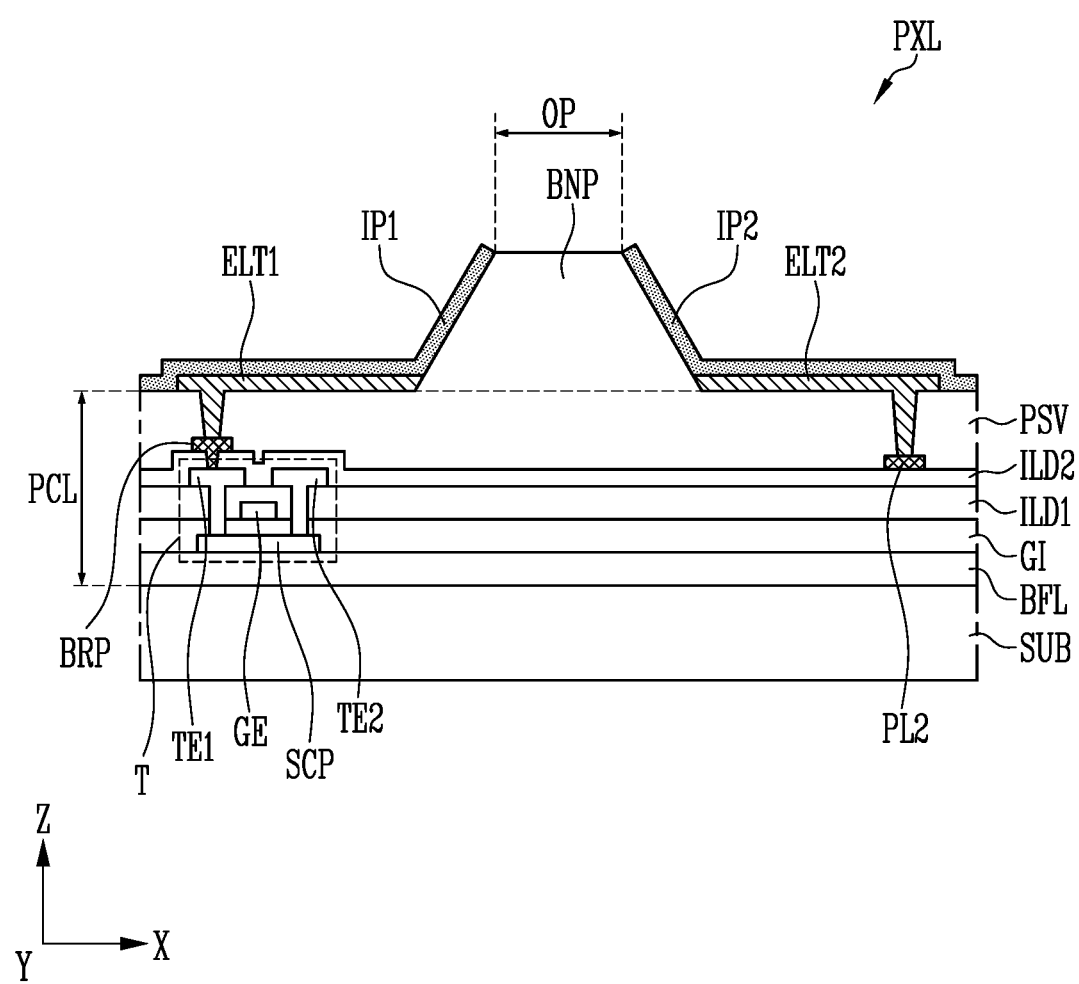

Referring to FIG. 20, subsequently, the inorganic layer IOL may be patterned to form an inclined pattern IP including an opening OP. The opening OP of the inclined pattern IP may expose the bank pattern BNP. The inclined pattern IP may be formed by being separated into a first inclined pattern IP1 formed or disposed on the first electrode ELT1 and a second inclined pattern IP2 formed or disposed on the second electrode ELT2.

Figure 21:
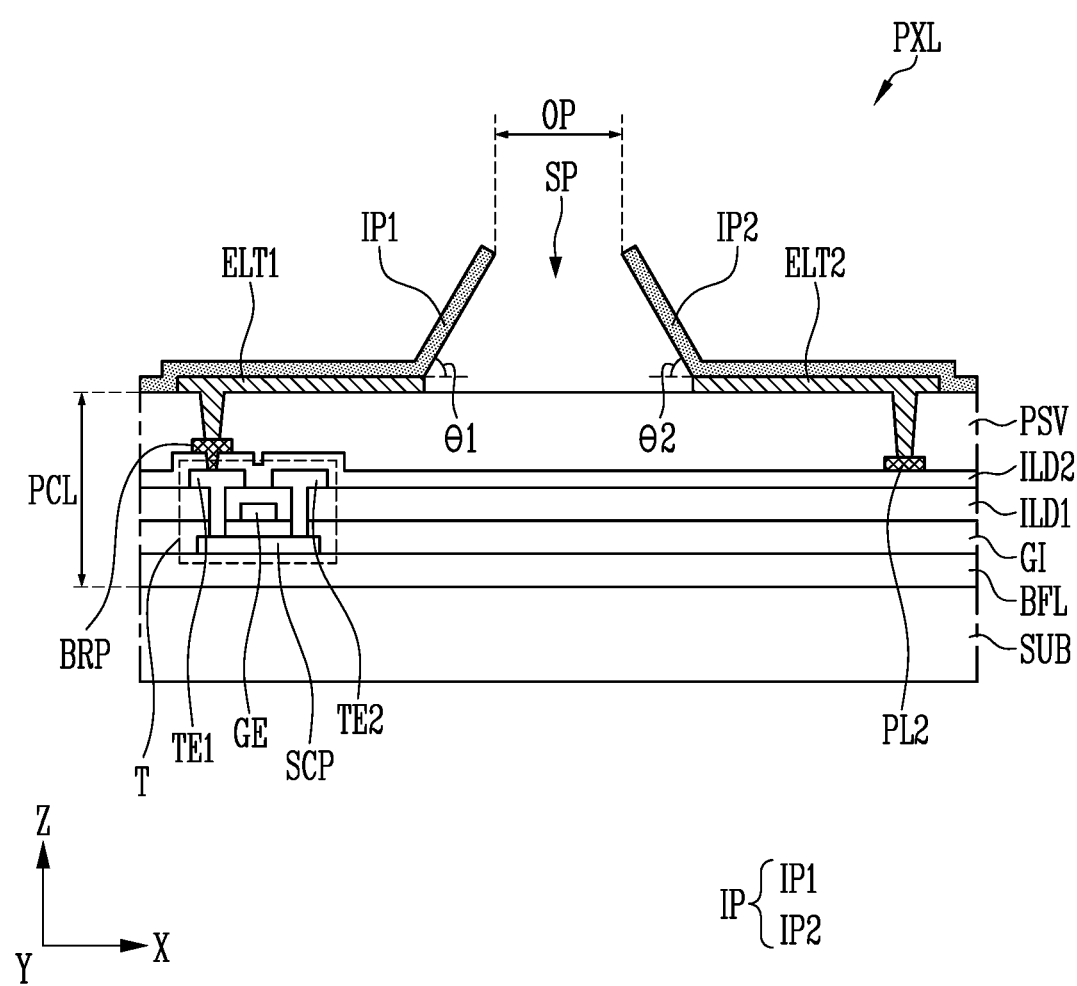

Referring to FIG. 21, subsequently, the bank pattern BNP may be removed. The bank pattern BNP may be etched through the opening OP of the inclined pattern IP to be removed. The inclined pattern IP may define or form a space SP remaining after the bank pattern BNP is removed. For example, the shape of the space SP may follow or substantially follow the shape of the bank pattern BNP.

Even if the bank pattern BNP is removed, the inclined pattern IP may maintain the shape disposed on the bank pattern BNP as it is. For example, an inclination angle $\theta 1$ of the first inclined pattern IP1 may be substantially the same as the first inclination angle $\theta b1$ on one or a side of the bank pattern BNP described above. An inclination angle $\theta 2$ of the second inclined pattern IP2 may be substantially the same as the second inclination angle $\theta b2$ on the other side of the bank pattern BNP described above.

Figure 22:
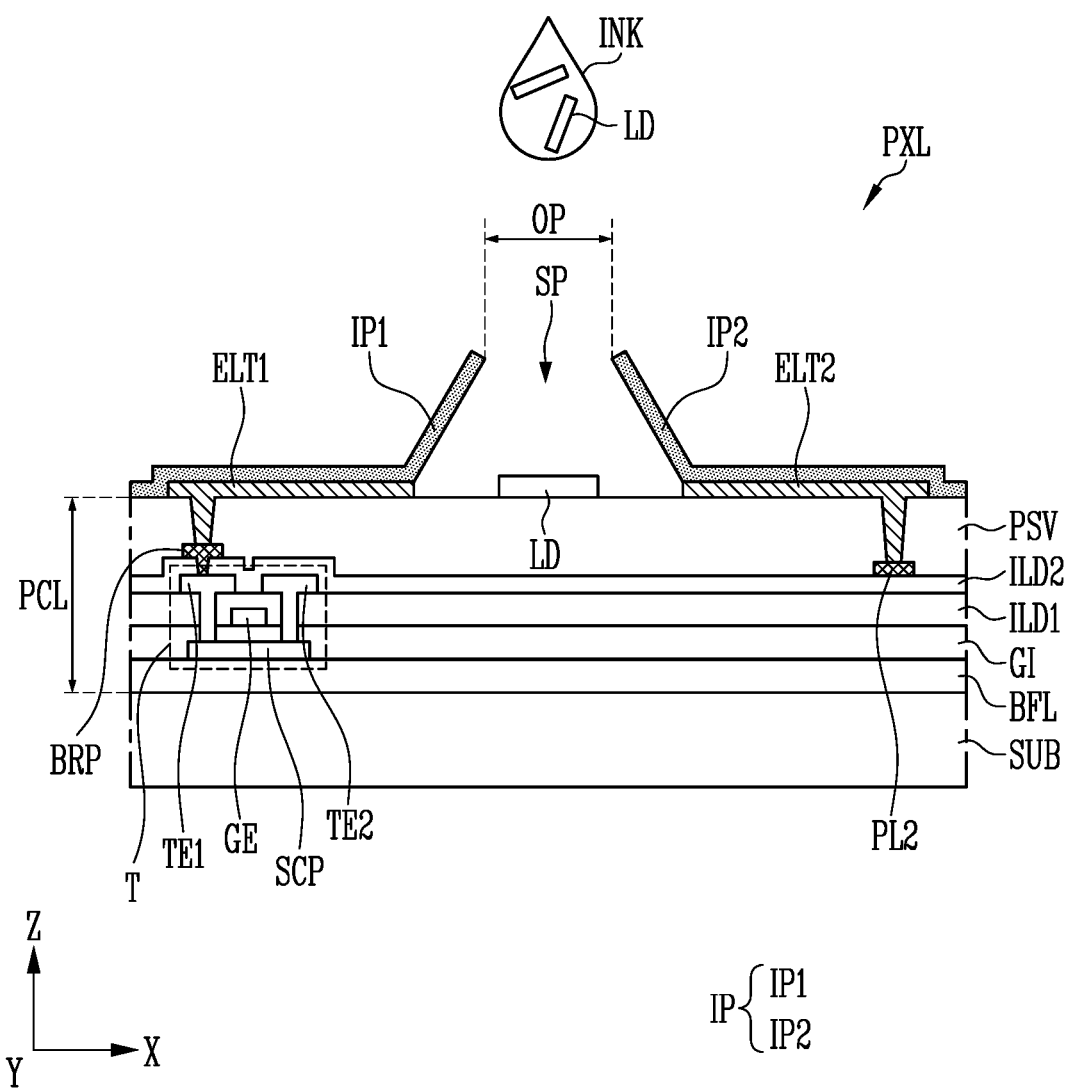

Referring to FIG. 22, subsequently, light emitting elements LD may be provided or disposed into the space SP through the opening OP of the inclined pattern IP. The light emitting elements LD may be dispersed or included in a predetermined solution and prepared in the form of ink INK, and may be supplied to the emission region of each of the pixels PXL by an inkjet printing method or the like within the spirit and the scope of the disclosure. While the light emitting elements LD are supplied, the inclined pattern IP may function to accommodate the ink INK in which the light emitting elements LD are dispersed. Accordingly, the light emitting element LD may be selectively supplied into the space SP defined or formed by the inclined pattern IP. Therefore, the loss of the ink INK may be minimized as described above. After the light emitting elements LD are supplied into the space SP, a predetermined voltage is supplied through the first electrode ELT1 and the second electrode ELT2 of each of the pixels PXL. As an electric field is formed between the first electrode ELT1 and the second electrode ELT2, the light emitting elements LD may be aligned between the first electrode ELT1 and the second electrode ELT2. After the light emitting elements LD are aligned, the light emitting elements LD may be stably arranged or disposed between the first electrode ELT1 and the second electrode ELT2 by volatilizing the solution or removing the solution by another method or other methods.

Figure 23:
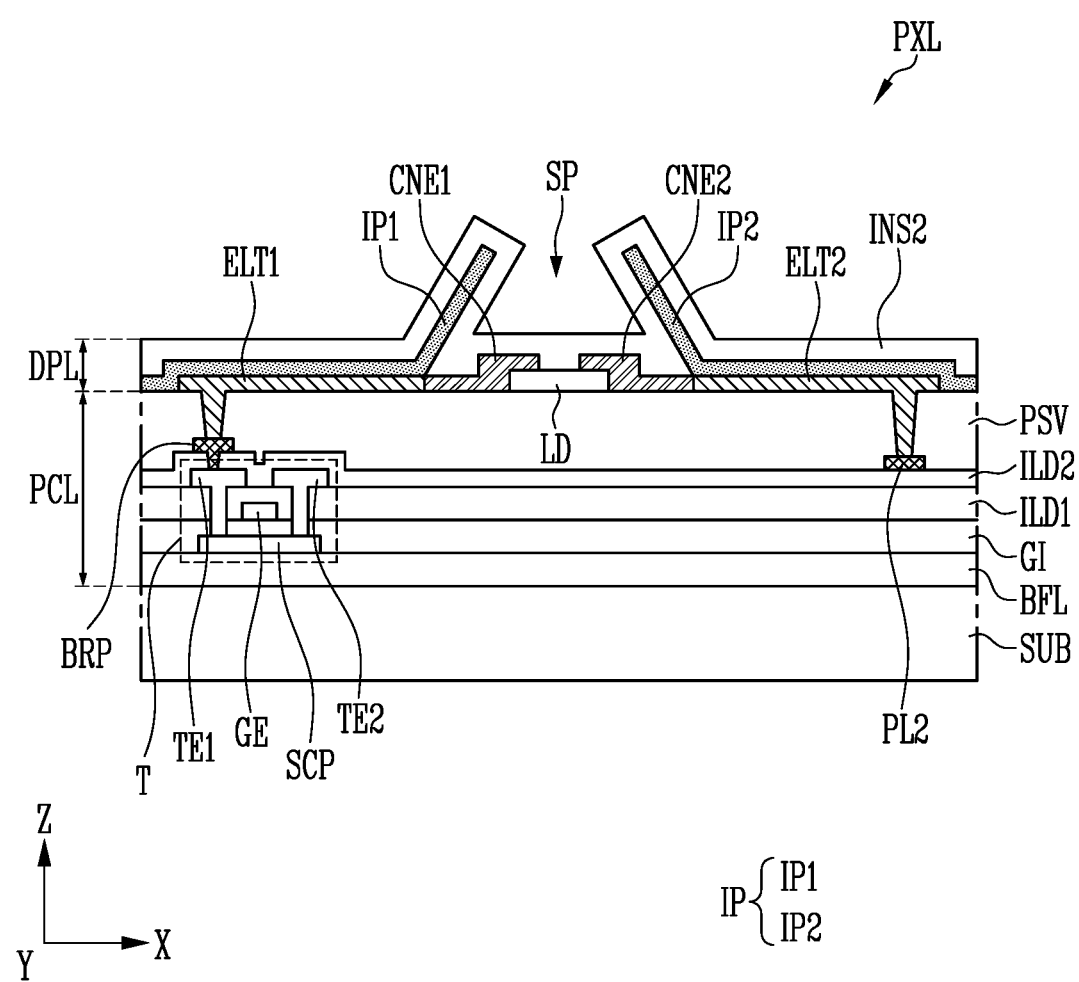

Referring to FIG. 23, subsequently, the display device shown in FIG. 9 may be completed by forming first and second contact electrodes CNE1 and CNE2 and a second insulating layer INS2 on the light emitting elements LD. The first contact electrode CNE1 may be formed in the space SP to electrically connect one or an end of the light emitting element LD and the first electrode ELT1. The second contact electrode CNE2 may be formed in the space SP to electrically connect the other or another end of the light emitting element LD and the second electrode ELT2. The second insulating layer INS2 may be disposed on the entire surface of the substrate SUB to cover or overlap the first and second electrodes ELT1 and ELT2, the inclined pattern IP, the light emitting element LD, and the first and second contact electrodes CNE1 and CNE2. For example, the second insulating layer INS2 may cover or overlap or directly cover or overlap the first and second electrodes ELT1 and ELT2, the inclined pattern IP, the light emitting element LD, and/or the first and second contact electrodes CNE1 and CNE2. In an embodiment, the second insulating layer INS2 may cover or overlap or directly cover or overlap the inclined pattern IP inside of the space SP. The second insulating layer INS2 may cover or overlap or directly cover or overlap the light emitting element LD, the first contact electrode CNE1 and/or the second contact electrode CNE2 inside of the space SP, but the disclosure is not limited thereto.

According to embodiments, in the process of supplying the light emitting element to each pixel, the light emitting element may be accommodated in the space defined or formed by the inclined pattern. That is, the light emitting element may be selectively supplied into the space. Therefore, the loss of material may be minimized and the manufacturing cost may be reduced.

The light emitted from the light emitting element may be totally reflected by the inclined pattern and may be emitted in the front direction of the display panel. Accordingly, the front emission efficiency in the display device can be improved.

The effects according to embodiments are not limited by the contents disclosed above, more various effects are included in the disclosure.

Those skilled in the art will appreciate that various modifications and equivalent embodiments are possible without departing from the scope of the disclosure or essential features of the disclosure. Therefore, it is to be understood that the embodiments as described above have been disclosed for illustrative purposes only and are not intended to limit the scope of the disclosure. The scope of the disclosure should be determined by the appended claims and the foregoing description. All changes or modifications derived from the meaning and scope of the claims and their equivalents should be construed as being included in the scope of the disclosure.

What is claimed is:

1. A display device comprising:
   a substrate including a plurality of pixels;
   a first electrode and a second electrode disposed on the substrate and spaced apart from each other;
   an inclined pattern disposed on the first electrode and the second electrode, the inclined pattern forming a space; and
   a first light emitting element disposed between the first electrode and the second electrode inside of the space formed by the inclined pattern, wherein
   the inclined pattern includes an opening at least partially overlapping the first light emitting element.

2. The display device of claim 1, wherein the space formed by the inclined pattern is located between the first electrode and the second electrode.

3. The display device of claim 1, wherein the inclined pattern includes an inorganic insulating material.

4. The display device of claim 1, wherein
   the inclined pattern includes a plurality of first layers and a plurality of second layers having different refractive indices, and
   the plurality of first layers and the plurality of second layers are alternately stacked.

5. The display device of claim 1, further comprising:
   a second insulating layer overlapping the inclined pattern inside of the space formed by the inclined pattern.

6. The display device of claim 1, further comprising:
   a second light emitting element disposed on the inclined pattern outside of the space formed by the inclined pattern.

7. The display device of claim 1, wherein the inclined pattern includes:
   a first inclined pattern disposed on the first electrode; and
   a second inclined pattern disposed on the second electrode.

8. The display device of claim 7, wherein an inclination angle of the first inclined pattern is substantially same as an inclination angle of the second inclined pattern.

9. The display device of claim 1, further comprising:
   a first contact electrode electrically connecting an end of the first light emitting element to the first electrode; and
   a second contact electrode electrically connecting another end of the first light emitting element to the second electrode,
   wherein the first contact electrode and the second contact electrode are disposed inside of the space formed by the inclined pattern.

10. The display device of claim 9, wherein the first contact electrode and the second contact electrode are disposed on a same layer.

11. The display device of claim 9, further comprising:
    a first insulating layer disposed between the first contact electrode and the second contact electrode.

* * * * *